United States Patent
Krebs

(12) 
(10) Patent No.: US 10,771,849 B2
(45) Date of Patent: Sep. 8, 2020

(54) MULTIMEDIA SYSTEM FOR MOBILE CLIENT PLATFORMS

(71) Applicant: Mark Sinclair Krebs, Toronto (CA)

(72) Inventor: Mark Sinclair Krebs, Toronto (CA)

( * ) Notice: Subject to any disclaimer, the term of this patent is extended or adjusted under 35 U.S.C. 154(b) by 8 days.

(21) Appl. No.: 16/181,285

(22) Filed: Nov. 5, 2018

(65) Prior Publication Data

US 2019/0075361 A1 Mar. 7, 2019

Related U.S. Application Data

(63) Continuation of application No. 15/016,821, filed on Feb. 5, 2016, now Pat. No. 10,171,873, which is a
(Continued)

(51) Int. Cl.
*H04N 21/462* (2011.01)
*H03M 7/42* (2006.01)
(Continued)

(52) U.S. Cl.
CPC ......... *H04N 21/4621* (2013.01); *G06F 16/41* (2019.01); *H03M 7/42* (2013.01);
(Continued)

(58) Field of Classification Search
CPC .... H04N 21/4621; H04N 19/40; H04N 19/46; H04N 21/6181; H03M 7/42; G06F 16/41
(Continued)

(56) References Cited

U.S. PATENT DOCUMENTS

| 5,202,961 A | 4/1993 | Mills et al. |
| 5,414,455 A | 5/1995 | Hooper et al. |

(Continued)

FOREIGN PATENT DOCUMENTS

| EP | 0762300 A2 | 3/1997 |
| EP | 1411698 A1 | 4/2004 |

(Continued)

OTHER PUBLICATIONS

Alex Zambelli, "IIS Smooth Streaming Technical Overview," Microsoft Silverlight Windows Server Internet Information Services, Mar. 2009, pp. 1-17, Microsoft Corporation.
(Continued)

*Primary Examiner* — Sath V Perungavoor
*Assistant Examiner* — Kristin Dobbs
(74) *Attorney, Agent, or Firm* — Elan IP Inc.

(57) ABSTRACT

A method for multimedia playback and transmission to wireless clients is described. A host webserver transcodes a live digital or analog audio-visual or audio broadcast signal and splits the input stream into small multimedia objects of an efficient compression such as MPEG4/AAC, and then immediately deploys the objects to distributed content servers for a geographically dispersed population of wireless clients. A java applet object player, downloaded to wireless clients at the beginning of the multimedia on-demand session, interprets and decodes the multimedia objects as they are received, using multiple levels of optimization. The applet uses novel video and audio decoding optimizations which can be generically applied to many digital video and audio codecs, and specifically decodes Simple Profile MPEG4 video and Low Complexity AAC audio.

9 Claims, 21 Drawing Sheets

Related U.S. Application Data continuation of application No. 11/107,952, filed on Apr. 18, 2005, now abandoned.

(51) Int. Cl.
*H04N 19/40* (2014.01)
*H04N 19/46* (2014.01)
*H04N 21/61* (2011.01)
*G06F 16/41* (2019.01)

(52) U.S. Cl.
CPC ............ *H04N 19/40* (2014.11); *H04N 19/46* (2014.11); *H04N 21/6181* (2013.01)

(58) Field of Classification Search
USPC ........................................................ 375/240
See application file for complete search history.

(56) References Cited

U.S. PATENT DOCUMENTS

| | | |
|---|---|---|
| 5,434,678 A | 7/1995 | Abecassis |
| 5,434,860 A | 7/1995 | Riddle |
| 5,579,239 A | 11/1996 | Freeman et al. |
| 5,610,841 A | 3/1997 | Tanaka et al. |
| 5,612,742 A | 3/1997 | Krause et al. |
| 5,751,883 A | 5/1998 | Ottesen et al. |
| 5,751,968 A | 5/1998 | Cohen |
| 5,819,160 A | 10/1998 | Foladare et al. |
| 5,821,986 A | 10/1998 | Yuan et al. |
| 5,841,432 A | 11/1998 | Carmel et al. |
| 5,892,915 A | 4/1999 | Duso et al. |
| 5,903,673 A | 5/1999 | Wang et al. |
| 5,928,330 A | 7/1999 | Goetz et al. |
| 5,933,603 A | 8/1999 | Vahalia et al. |
| 5,953,506 A | 9/1999 | Kalra et al. |
| 5,974,503 A | 10/1999 | Venkatesh et al. |
| 5,987,510 A | 11/1999 | Imai et al. |
| 5,996,015 A | 11/1999 | Day et al. |
| 6,014,694 A | 1/2000 | Aharoni et al. |
| 6,014,706 A | 1/2000 | Cannon et al. |
| 6,032,193 A | 2/2000 | Sullivan |
| 6,112,226 A | 8/2000 | Weaver et al. |
| 6,119,154 A | 9/2000 | Weaver et al. |
| 6,138,147 A | 10/2000 | Weaver et al. |
| 6,151,632 A | 11/2000 | Chaddha et al. |
| 6,195,352 B1 | 2/2001 | Cushman et al. |
| 6,292,834 B1 | 9/2001 | Ravi et al. |
| 6,385,596 B1 | 5/2002 | Wiser et al. |
| 6,389,473 B1 | 5/2002 | Carmel et al. |
| 6,397,230 B1 | 5/2002 | Carmel et al. |
| 6,490,320 B1 * | 12/2002 | Vetro ...................... H04L 29/06 375/240.08 |
| 6,536,043 B1 | 3/2003 | Guedalia |
| 6,747,991 B1 * | 6/2004 | Hemy .............. H04N 21/23418 370/236 |
| 6,963,972 B1 * | 11/2005 | Chang ................. H04L 63/0442 348/E7.056 |
| 7,120,194 B2 | 10/2006 | Lee |
| 7,295,608 B2 | 11/2007 | Reynolds et al. |
| 9,800,538 B2 | 10/2017 | Mostafa |
| 2001/0042107 A1 | 11/2001 | Palm |
| 2002/0120675 A1 | 8/2002 | Everett et al. |
| 2003/0204605 A1 | 10/2003 | Hudson et al. |
| 2004/0194144 A1 | 9/2004 | Lin et al. |
| 2005/0076136 A1 | 4/2005 | Cho et al. |
| 2007/0298719 A1 | 12/2007 | Sproule et al. |

FOREIGN PATENT DOCUMENTS

| | | |
|---|---|---|
| WO | 9730551 A1 | 8/1997 |
| WO | 0193161 A1 | 12/2001 |
| WO | 02082292 A1 | 10/2002 |

OTHER PUBLICATIONS

Li et al., "Two Decades of Internet Video Streaming: A Retrospective View", ACM Transactions on Multimedia Computing, Oct. 2013, pp. 1-20, vol. 33 No. 9.
Luiz Fernando Capretz, "A Brief History of the Object-Oriented Approach," ACM SIGSOFT, Mar. 2003, vol. 28. No. 6., pp. 1-11, Software Engineering Notes, 10.1145/638750.638778.
Schwartz Communications, Inc., "GEO Interactive Unveils Emblaze Live Technology; Revolutionary Emblaze Technology Used for White House EasterLink Cybercast; No plug-ins or Server Software Required," The Free Library, Apr. 13, 1998, pp. 1-3, Business Wire.
Realnetworks Inc., "RealSystem G2 Production Guide" BETA 1 Release, May 14 2002, pp. 1-130.
Li et al, "Distributed Multimedia Systems," Proceedings of the IEEE, Jul. 1997, pp. 1063-1108,, vol. 85 No. 7.
Franc Kozamernik, "Media Streaming over the internet", EBU Technical Review, Oct. 2002, pp. 1-15, Webcasting.
Zhang et al., "Resource Allocation for Multimedia Streaming Over the Internet," IEEE Transactions on Multimedia, Sep. 2001, vol. 3. No. 3, pp. 339-355.
Krasic et al., "The Case for Streaming Multimedia with TCP," Lecture Notes in Computer Science, Aug. 2001, pp. 1-6, vol. 2158.
Shahabi et al., "Yima: A Second-Generation Continuous Media Server" Computer, Jun. 2002, pp. 56-62, vol. 35 No. 6, IEEE.

\* cited by examiner

FIG 3

| MO | Event |
|----|-------|
| 0 | in window |
| 1 | in window |
| 2 | in window |
| 3 | in window |
| 4 | in window |
| 0 | deleted |
| 5 | in window |
| 1 | deleted |

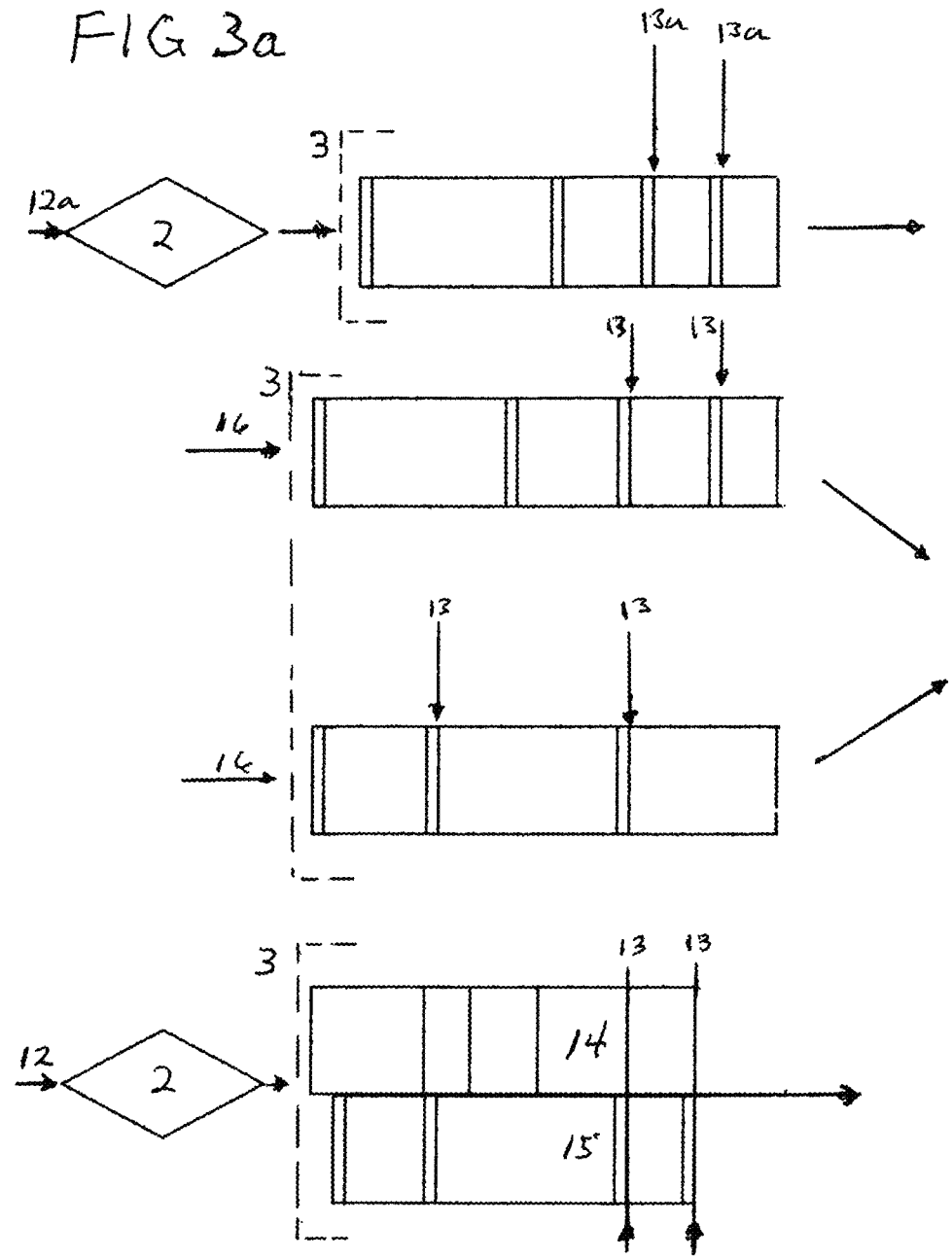

MULTIMEDIA SYSTEM FOR MOBILE CLIENT PLATFORMS

FIELD OF INVENTION

The invention relates to issues of the wireless Internet, specifically to methods of multimedia transmission and playback for mobile clients.

BACKGROUND OF THE INVENTION

The current methods of distributing multimedia data over the wireless Internet to mobile clients are constrained by existing wireless bandwidth, and the real-time decoding, processing and displaying of multimedia content with limited hardware capabilities. These hardware limitations include slow CPUs, high memory latencies, slow drawing capabilities and the absence of YUV to RGB conversion in the hardware.

Video and audio playback exist on certain cell phone handsets, but this technology is embedded and takes advantage of low-level hardware processing to enable the performance required for media playback. Through embedded media players, several cell phone handsets and handheld computers can play either streamed video or audio. Popular digital video encoding standards for some handsets are H263 and MPEG4. The audio codecs, MP3, AMR and AAC, are also typically supported on some mobile handhelds. Newer video codecs, like H264 could be used for video transmission to cell phones, but would require clients systems with fast memory access for their motion compensation methods.

Embedded streaming media players rely on firmware integration to take advantage of the multitasking capabilities of cell phone handsets. At the time of this writing, most cell phones cannot support multimedia playback because they are only capable of supporting one or a few concurrent processing threads. On handsets that have embedded media players, video is also limited to very low frame rates and the bandwidth available for streaming in North America is low, varying from 2-3 kybtes/second to ISDN speeds of 64 Kbits. European countries and Japan currently offer 3G network connection speeds, varying from 64 kbits-300 Kbits, and offer more technologically advanced cell phones with embedded media players that can achieve higher video frame rates. For limited per usage periods and some, EV-DO (Evolution Data Optimized) networks can also provide these higher speeds over local CDMA networks.

Decoders for complex video codecs which support highly scalable MPEG4 video, and more complex, CD quality music, audio codecs like AAC, require multiple parallel processes and fast processing. Mathematical algorithms, as in Fan and Madisetti, designed for the high number of floating point samples for higher end MPEG4 and AAC, which requires a sample rate approximately 36,000 floating point calculations/second, are intended to run on specialized chips. Even at lower and very low bitrates, where MPEG4 is more efficient than its predecessors, MPEG4 software players depend on PC multitasking or hardware APIs for efficient processing to draw video frames.

Currently, device independent Java (J2ME) offers two standard configurations on mobile clients. The Connected Limited Device Configuration (CLDC) is prevalent in the J2ME world, and powers cellular phones, pagers, PDAs, and other handheld devices. A variant of CLDC, Connected Device Configuration (CDC) targets more powerful devices, such as home appliances, set-top boxes, and Internet TVs.

The second configuration, Mobile Information Device Profile (MIDP), runs on top of the CLDC, and several profiles run on top of CDC.

Java players for cell phones like the Oplayo MVQ player exist, but implementations of true, platform independent, MPEG4 Java decoders that will play video on cell phones are not known. More efficient methods, such as U.S. Pat. No. 5,699,121, do not rely on DCT motion compensation, and propose pattern marching to identify regions in the motion residual signal that have not been accurately reproduced and to correct them using a pattern library. But again, this approach does not use MPEG4 video encoding.

Similarly, although Java decoders exist that play MP3 ringtones on cell phones, no Java players are known that will play AAC. In fact, many of the newer IDCT algorithms are targeted more towards customized logic chips that only do IDCT (composed of many simple pipelined instructions as opposed to a few more complex ones).

Bit streaming is the standard method of transmitting audio or video to cell phones over wireless networks. Streamed bits are buffered and then decoded or entire video files are downloaded or proportionately cached, or as in progressive, http streaming downloading to a point where complete, continuous playback is deemed possible. In the case of wireless networks, bit streaming in terms of audio/video content is usually is done over a non-reliable transport like UDP and requires a lot of error correction and duplication of content (extra stream correction data). Advances in these transmission methods do propose more sophisticated means of reserved bandwidth, such as AROMA. Alternatives to streaming methods have been proposed for the transmission of video as objects through pre-fetched lists Waese et al., U.S. Pat. No. 6,286,031, which are similar to downloading pre-fetched lists of SMIL objects, and instant or scheduled notification file downloading Stumm, U.S. Pat. No. 5,768, 528. However, these do not address specific continuity and deployment issues for wireless multimedia transmission and concurrent playback on a limited-tasking cell phone handsets.

Streaming also requires client processing for significant error correction in video decoding, adaptive encoding for varying channel bitrates and in cellular networks. It also requires the use of cellular MMS multimedia protocol.

The object of the current invention is to solve one or more of the drawbacks in existing methods discussed above, or to provide other improvements to the art.

SUMMARY OF THE INVENTION

The invention relates to wireless Internet multimedia transmission and wireless clients. In a first aspect the invention provides a method of efficient multimedia object creation. In a second aspect the invention deployment addresses the limitations of large-scale multimedia transmission on cellular networks to wireless clients. In a third aspect, the invention relates to methods of decoding of video, sufficiently optimized to be played on a limited wireless client. In a fourth aspect, the invention relates to methods of decoding of audio, sufficiently optimized to be played on a limited wireless client. In a fifth aspect, the limited mobile handset multimedia object player, for both MPEG4 video decoding and AAC audio decoding, is implemented as a device-hardware-independent java (J2ME) applet.

In its first aspect, the invention pertains to efficiently transmittable multimedia object creation. A server-based transcoder, coupled with a multimedia object creator, inputs a standard analog signal or alternative digital signal like MPEG2, and converts this signal into true MPEG4/AAC multimedia objects. As multimedia objects they can then be dynamically uploaded to multiple live content hosting web servers, which, through proximate mobile network proxy servers, make live content accessible to mobile clients as consecutive multimedia objects.

The multimedia object creator produces discrete multimedia objects from video and audio segments of a continuous stream. If the stream is MPEG4, multimedia objects can also be segments of multiple component video and audio streams. In the case of multiple MPEG4 component streams, per object segmentation and decoding can enable the composition of a single scene from several temporally-independent multimedia objects. This provides the possibility of decoding only a limited number of multimedia objects, and not all objects, to provide an object-based scalability.

Multimedia objects are discrete, and also have distinctive Internet addresses, and hence, the mobile client will have the opportunity to interact with any given media sequence on a per object basis. In cases where the multimedia object sequence is being transcoded from a live stream, a window of multimedia objects is made available on the host server. This window would be comprised of a number of recently created multimedia objects. To minimize delays that will occur to maintain synchronicity between the client and server, a larger multimedia object window can be dynamically created on the host server.

In cases where the media object sequence has been previously transcoded and resides on the host as a non-live source, each object is numerically ordered. The transport mechanism for the multimedia objects is assumed to be HTTP for the purposes of illustration, however, other protocols which access content through file and directory structures could be used. For example FTP, IMAP4 and NNTP all have the capability to serve files in a directory structure.

On the client side, the number of multimedia objects that can be buffered in memory is based on the size of the first multimedia object The amount of free memory available and the processing of further multimedia objects in the sequence can be optional and dependent on whether the implementation allows the modification of object parameters between multimedia objects (such as the size of the visual frame or the sample rate of the audio stream). The buffering and playback of multimedia objects in a synchronized fashion is critical to fluid playback.

The wireless networks over which the limited devices operate often have a very high latency. The HTTP 1.1 protocol and some implementations of HTTP 1.0 allow the use of a persistent connection over TCP to perform multiple requests. Furthermore, some HTTP 1.1 implementations allow the use of pipelined connections allowing the HTTP client to perform many requests in rapid succession decreasing the latency between the request and reception of each multimedia object. When possible, the invention can take advantage of this capability.

In its second aspect, the invention pertains to multimedia object deployment to large numbers widely distributed wireless Internet clients. Media content converted to multimedia objects must be available to many users and the distribution system must be sufficiently robust to allow peaks in demand and have sufficient geographic proximity that network congestion and latency are reduced.

In this second aspect, and in the case of live content transcoding from a live audio/video stream, the transcoding of input media formats and the creation multimedia objects is done in real-time and immediately deployed to every content server of the distributed system. These content servers may be at the same location, or they may be geographically placed to support local mobile clients and take advantage of alternative mobile network proxy servers and proxy server object caching. The distribution of multimedia objects to alternative content servers can take place on the wired Internet.

In a third aspect, the invention provides novel optimizations for digital video decoding. Some of these optimizations can then be used by an expert assessment process, whereby, the decoder maintains a state information list of short-cuts, related to perceived frame rate in a sorted list starting with those that will decrease output quality the least, to those that will decrease output quality the most but have the most impact on decoding speed. The client player-decoder dynamically adjusts how many shortcuts must be taken. These short-cuts are specifically designed to drastically reduce the number of computations necessary at certain critical steps in the video decoding process at the cost video output quality. This allows the video decoder to scale in complexity based on the processing power of the device being used. It also allows users to experience multimedia playback despite the limitations of the device they may be using.

In a fourth aspect, the invention pertains to decoding audio on a limited mobile device. Mobile devices present many challenges for audio playback. Typical mobile processors have integer math only, little or no on-CPU cache, and a limited audio output interface. The present invention takes several approaches to getting maximum audio quality out of these very limited devices, which are applicable to other audio codecs such as AC3, AMR and WMA v9, as well as AAC LC. These include a novel use of Huffman codebooks, a highly optimized IMDCT process, and innovative windowing optimizations.

One of the serious limitations of mobile devices is their inability to play continuous sound. There is no way to play a long sound without gaps which occur when switching from one block of sound to the next block of sound. The proposed invention also solves this gapping problem by intelligent placement of the gaps. A frame of low total energy is selected, and the playback is controlled so that the gap will occur during that frame. The low-energy frame may be dropped so that synchronization is not lost.

In a fifth aspect, the invention pertains to the implementation of a mobile handset MPEG4 video and AAC audio player that is hardware-independent and operating system independent, and can simply be downloaded prior to media playback on mobile clients that do not have embedded media players. Hardware and operating system independence are characteristics of Java applets, but Java cannot take advantage of hardware capabilities in processing the huge number of calculations and variables required for either MPEG4 decoding or AAC decoding on limited processing mobile handset. Hence, the required optimizations for Java itself, to permit the playback of AAC and MPEG4 on current mobile client hardware, are a source of technological innovation and advance.

BRIEF DESCRIPTION OF THE DRAWINGS

For a better understanding of the present invention and to show more clearly how it may be carried into effect, reference will now be made, by way of example, to the accompanying drawings which show the preferred embodiment of the present invention and in which:

FIG. 3 illustrates a multimedia object windowing sequence for a live transmission of multimedia objects created by the multimedia object creator of FIG. 1; and FIG. 3*a* illustrates multimedia object creation for single stream multimedia, just audio and multi-stream MPEG4 composite layers by the multimedia object creator of FIG. 1.

DETAILED DESCRIPTION OF THE PREFERRED EMBODIMENT

Figure 1:
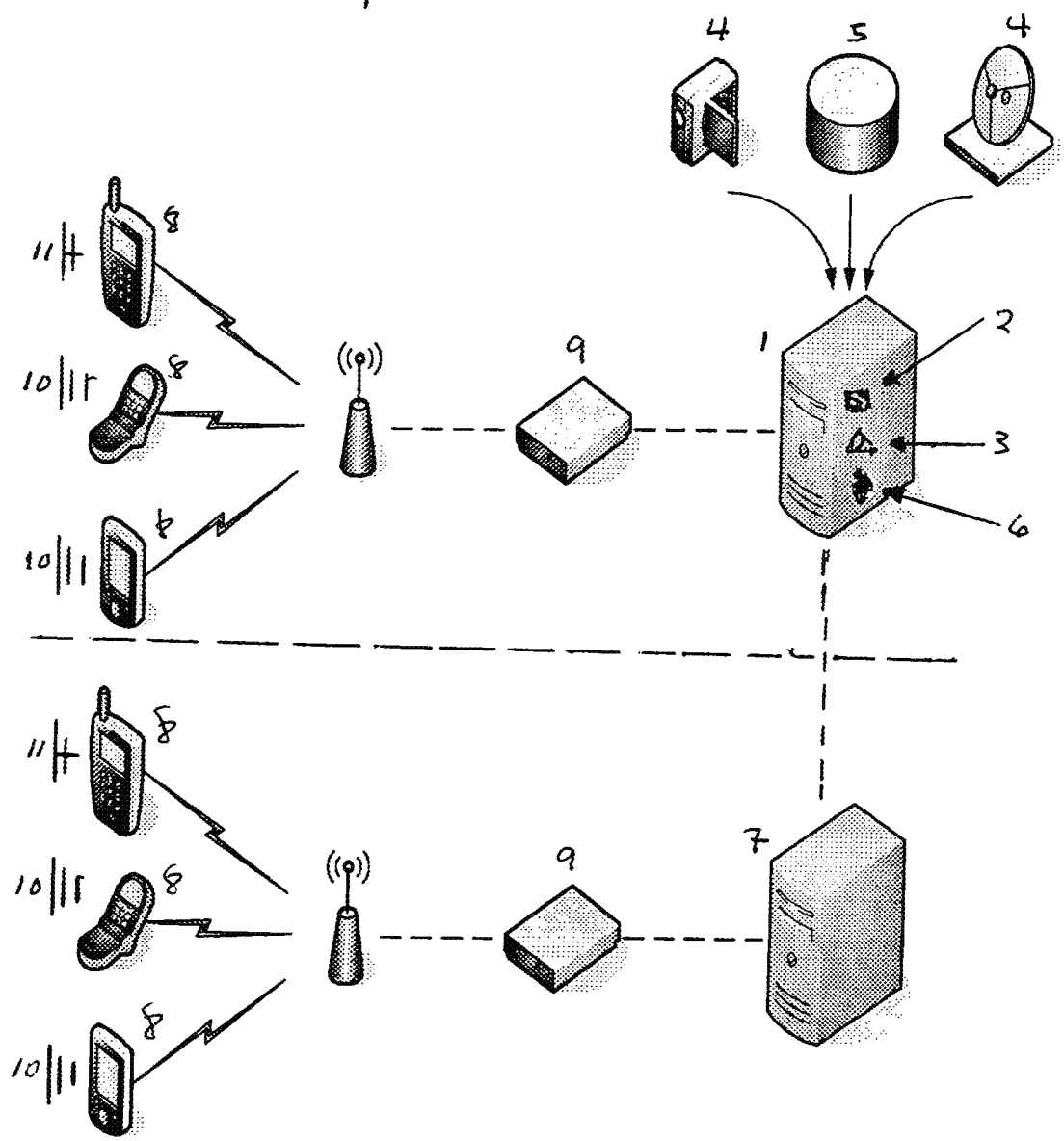
FIG. 1 is a general diagram for a distributed network system for multimedia-on-demand, utilizing a centralized content server, indexing host, Multimedia object creator and transcoder for live broadcast applications or to transcode and create multimedia objects from archived multimedia files, and distributed content servers involving high capacity cellular network proxy servers and mobile clients running downloaded Java applets or embedded or downloaded non-java multimedia object players.

FIG. 1 illustrates a centralized content server system 1, utilizing a transcoder 2 and a multimedia object creator 3 to create, multimedia objects from a live broadcast 4 or to transcode and create multimedia objects from archived multimedia files 5. The central server includes an indexing host system 6 to deploy created multimedia objects to relevant content servers 7 through the wired Internet and to verify all geographically dispersed wireless clients 8. The system includes the potential use of proxy cellular network http servers 9, which can cache large numbers of small multimedia objects to support large numbers of concurrent wireless clients 8 running multimedia object java applets 10 or embedded or downloaded non-java multimedia players 11.

Figure 2:
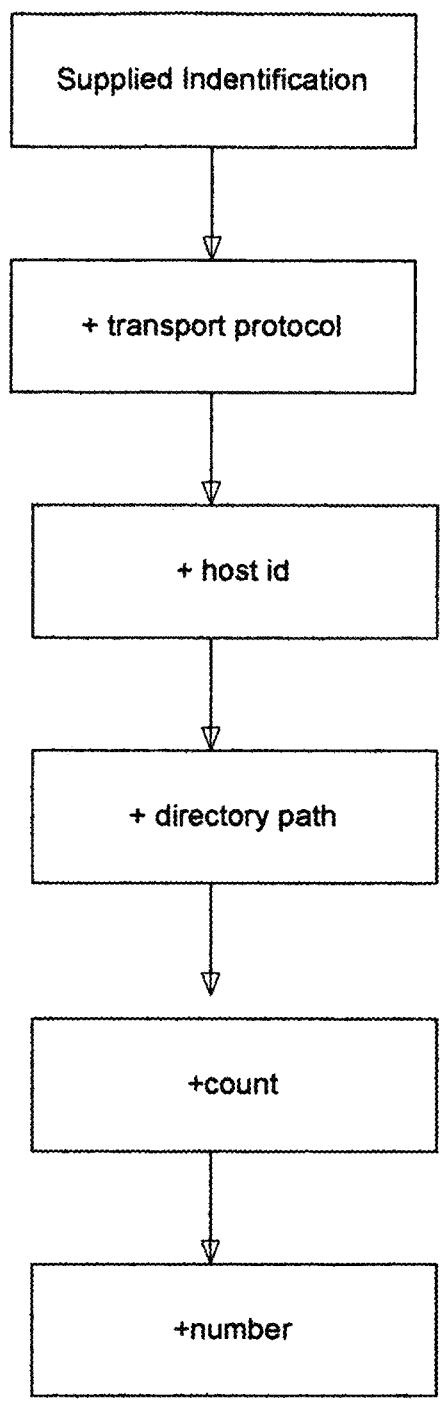
FIG. 2 is a flow diagram illustrating a multimedia object identification method by the multimedia object creator of FIG. 1 for mobile clients by the host content server of FIG. 1.

FIG. 2 is a flow diagram illustrating the process of multimedia object identification by the multimedia object creator 3. This process encodes a Supplied Identification to each multimedia object to identify the transport protocol, source host, path and number of objects of a particular multimedia stream.

The host directory name of the multimedia objects is formatted to contain the number of video objects located within the directory. An delimiting character is placed between the end of the directory name and the number indicating the multimedia object count. This allows the use of directory names terminating in numbers while indicating an unambiguous multimedia object count e.g. StarWars_1.mp4, StarWars_2.mp4, etc.

Multimedia objects within the directory are named similarly to directory name. However, instead of the multimedia count following the delimiting character, a number indicating the multimedia object's position within the sequence of multimedia object is specified. The following is an example:

Supplied Identification for MultimediaObjects:
<transport>://<host>/<path>/
  <MOSName><Delim><MOCount>

Computed Identification for each multimedia object based on Supplied Identification:
<SuppliedID>/
  <MOSName>.<MOSeqNum><Delim><MOType>

<transport>: protocol used to transmit multimedia objects
  <host>: Host content servers 1 or 7 serving the multimedia objects directly to mobile clients 8
  <path>: Path to the multimedia object directory
  <MOSName>: Name of the multimedia object sequence (perhaps the name of a broadcast)
  <MOCount>: Number of multimedia objects (Integer greater than zero)
  <MOSeqNum>: The multimedia object's sequence number (Integer greater then zero, less then or equal to MOCount)
<Delim>: The delimiting character
<MOType>: encoding type e.g. mp4

When multimedia has been transcoded from a non-live source, the first multimedia object in the sequence to be played could have the index 0 of a counting series. In cases where the multimedia object sequence is being transcoded by the multimedia object creator 3 from a live stream, a window of multimedia objects is made available on all content servers 1 and 7. This window would be comprised of a number of recently created multimedia objects transcoded from the live stream.

The window of multimedia objects allows clients to begin reception of a multimedia object sequence at an earlier point than the most recently created multimedia object. This mechanism provides an extra degree of forgiveness in high-latency situations, where there may be a delay between the client 8 discovering the most recent multimedia object and the actual request.

The window of multimedia objects would shift as more multimedia objects are transmitted from the live source. The multimedia object sequences would begin at 0 and be numbered sequentially. The window size hence permits the removal of earlier objects.

For example, a live stream may be made comprised of a window of four objects. Upon transmission of a fifth video object, the first multimedia object would be deleted, resulting in the following sequence illustrated in FIG. 3.

The wireless client 8 can have the capability to search forward in the multimedia object sequence among the multimedia video objects in window. This provides additional transmission continuity in cases where it is not possible to maintain sufficient bandwidth for all multimedia objects in the live sequence.

To reduce delays that will occur to maintain synchronicity between the client 8 and server 1 or 7, a larger multimedia object window can be used. Likewise, the mobile client 8 may also store more than two multimedia objects in the internal buffer. Moreover, wireless networks over which the limited devices operate often have a very high latency. This is especially evident when TCP's 3-way handshake must be performed for every connection that is made. It is therefore ideal to use an application protocol that is able to minimize the latency between each request for a multimedia object.

The transport mechanism for multimedia objects is assumed to be HTTP for the purposes of system FIG. 1, however, other protocols which access content through file and directory structures could be used. For example FTP, IMAP4 and NNTP all have the capability to serve files in a directory structure. HTTP 1.1 protocol and some implementations of HTTP 1.0 allow the use of a persistent connection over TCP to perform multiple requests. Furthermore, some HTTP 1.1 implementations allow the use of pipelined connections, allowing the HTTP client to perform many requests in rapid succession decreasing the latency between the request and reception of each multimedia object.

In FIG. 3a, the transcoder 2 and multimedia object creator 3 create multimedia objects of an optimal digital encoding such as MPEG4/AAC from analog multimedia or an alternative codec stream 12, such as MPEG1, MPEG2, MOV, AVI, WMV, ASF, and higher encoded MPEG4. First, the input stream is transcoded into MPEG4 and AAC and then it is split according to a specified interval, such as 10 seconds, into multimedia objects. The video component of the stream is scanned after the specified interval for the next I-frame 13, where the split is made. Since typically there are no predicted frames in digitized audio 15, a conditional split is made to correspond to the video segmentation 14. In the case of multiple MPEG4 component streams 16, multiple video and/or audio composite layers can also be split into multimedia objects at I-frames 13. In the case of just audio signal input 12a, the transcoded audio can be analog, or digital codecs, AMR, MP3, RealAudio or higher rate encoded AAC and then split into specified intervals 13a.

Figure 4:
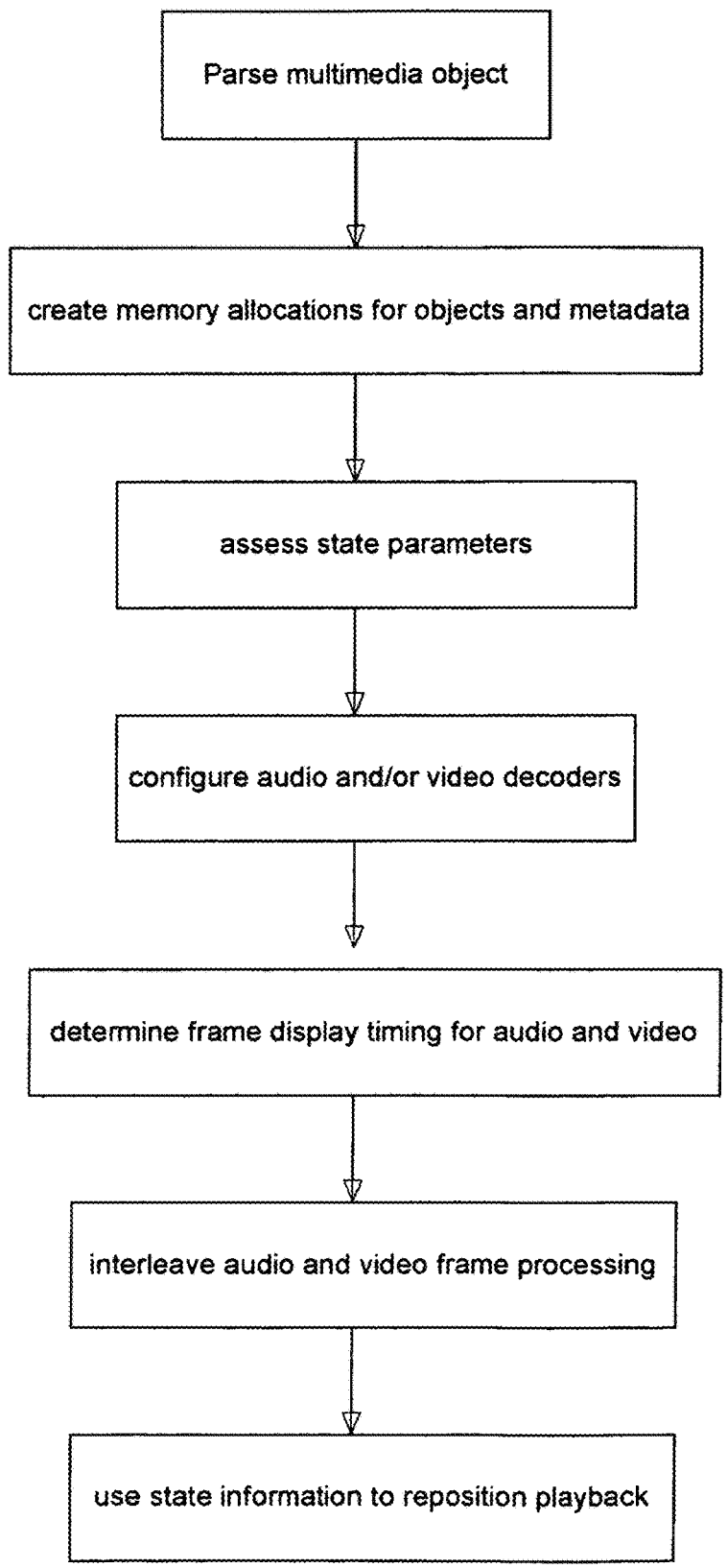
FIG. 4 is a flow diagram illustrating the steps of multimedia object processing by the multimedia object players of FIG. 1.

FIG. 4 is a flow diagram illustrating client side processing of multimedia objects. Multimedia object player 10 or 11 processing is initiated by the receipt of the first multimedia object from a content server 1 or 7. The first multimedia object's Identification is parsed and the total number of multimedia objects stored within the Indentification's <path> is determined, or the case of live transmission applications, the number of multimedia objects in window. Hence, heap memory allocations for the multimedia objects and meta-data can then be determined. These allocations are created of sufficient size that multimedia objects that follow can verwrite older multimedia objects in the same memory allocation without overflowing.

Depending on the amount of heap memory available on the device, several sets of memory allocations can be made to store multiple multimedia objects at once. This constitutes a multimedia object buffer and allows the decoder to be playing one multimedia object while the next has not yet fully completed reception. A device must have enough memory to allow two multimedia objects to be stored in the heap at once, otherwise the behavior is undefined (the decoder may refuse to play the multimedia object sequence, or play it with extended pauses between each multimedia object). Important state information is stored in several variables. This information includes the Integer values:

nMObjectPlaying—current Multimedia Object index playing
nMObjectRecving—current Multimedia Object index being received and Boolean value(s):
bWaitForBuffer—Indicates to the Playback component that it should way until buffering of further multimedia objects is complete This state information provides a mechanism with which the reception and playback of multimedia objects can be synchronized.

The multimedia object contains information required to properly configure the audio and video decoders, and this information is passed to the respective decoder.

After configuring the audio and/or video decoding components of the multimedia object player, the object player may choose to either delay playback until the multimedia object buffers in memory have filled or may begin playback immediately while requesting the next multimedia object concurrently. This decision can be based on the speed at which the multimedia objects are retrieved versus the playback time of each multimedia object, the latency of requests for multimedia objects or the number of multimedia objects that can be stored in memory at once.

Following the reception and parsing of the first multimedia, its audio And/or video content are hence parsed and played back. In the audio and/or video content of the first and every subsequent multimedia object, the approach taken is to decode sufficient audio frames that their total duration is as long as the display time of the associated video frame and processing time of the next audio frame. By interleaving the processing between several audio frames and a single video frame, the decoder can perform both audio and video decoding in a single thread.

The retrieval and playback of multimedia objects continues until the last multimedia object in the sequence has been completely retrieved and its playback has finished.

The state information described also provides a mechanism which can be used to skip backwards and forwards through the multimedia object sequence. By changing the state information and restarting the retrieval of multimedia objects, the playback of the objects can be repositioned to any multimedia object in the sequence.

Figure 5:
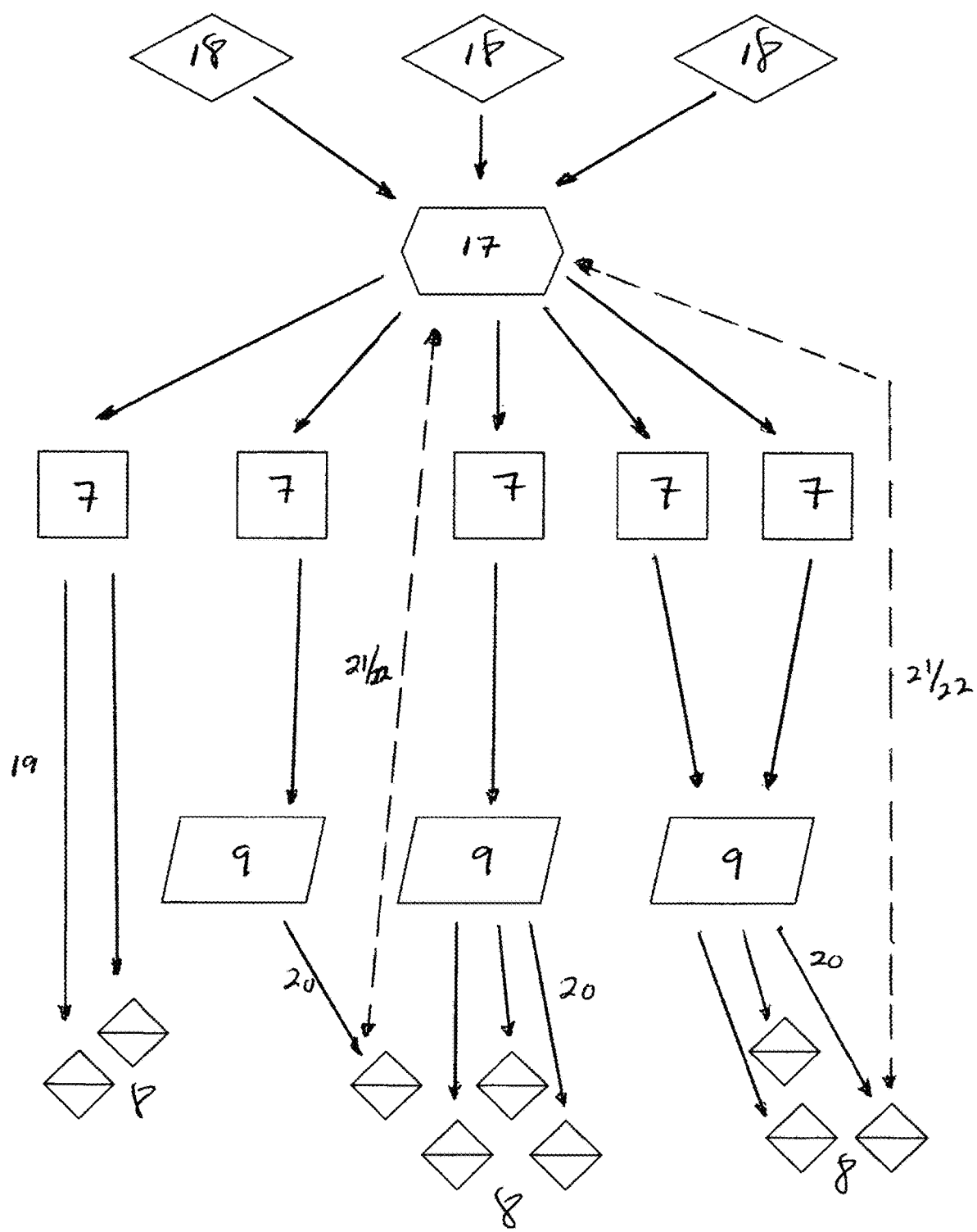
FIG. 5 is a diagram illustrating the architecture and processing interaction for the large scale distribution of live and archived multimedia content in the distributed network being managed by the indexing host of FIG. 1, involving remote transcoding/multimedia object creating servers and a central indexing host server.

In FIG. 5, a large scale "live content" application is illustrated. A central server indexing host 17 manages all of the available content and the content servers 7 through which the content is made available. Remote transcoding and multimedia object creating servers 18 that provide continuously updated content must register this content with the indexing host 18. The transcoding servers 18 must also keep the central indexing server 17 updated with the latest multimedia object sequence indices, to allow distributed wireless clients 8 to begin playback of any live content with minimal delay.

The URLs of any content servers supporting a particular broadcast would be pre-registered in a table on the indexing server 17.

Content servers 7 accept and store live content being transmitted from transcoding servers 18. They can also store non-live archive multimedia content, but in a live content type application, they need only cache the most current window of multimedia objects.

Content servers 7 are distributed in such a fashion that allows wireless clients 8 a fast and low latency host connection. Content servers 7 could all be connected in a LAN, but for large scale operations, they could have any distribution on the wired Internet. The wireless client 8 can receive the content directly 19 from a content server 7 or indirectly 20 through a cellular network proxy server 9.

The central indexing host 17 accepts requests from clients 8 for multimedia content 21. The indexing host 17 must reply with the most suitable content server 7 for the client 8. This can either be done in a round-robin fashion or other factors can be included such as the location of the client 8 relative to available content servers 7. Other information such as the server load and network congestion of each content server 7 can be taken into account.

The central indexing host 17 also authenticates 22 clients 8 as they request available content and specific pieces of content. The authentication process is designed in such a way that the content servers 7 do not need to maintain a list of authorized clients 8 and the content available to them. Instead the indexing host 17 authenticates the client 8 and provides the client 8 with an encrypted string that is eventually decrypted by the content server 7. This string is the encrypted form of the catenation of the content name or description, and the current UTC date-time and an interval of time for which the client 8 is authorized to access the multimedia content. The string is designed to allow the client 8 to access and playback multimedia objects received from a designated content server 7.

The indexing host 17 may also provide the client 8 with other information about the multimedia content, along with the encryption string, such as a description of the source, copyrights, and subtitle data-sources.

Figure 6:
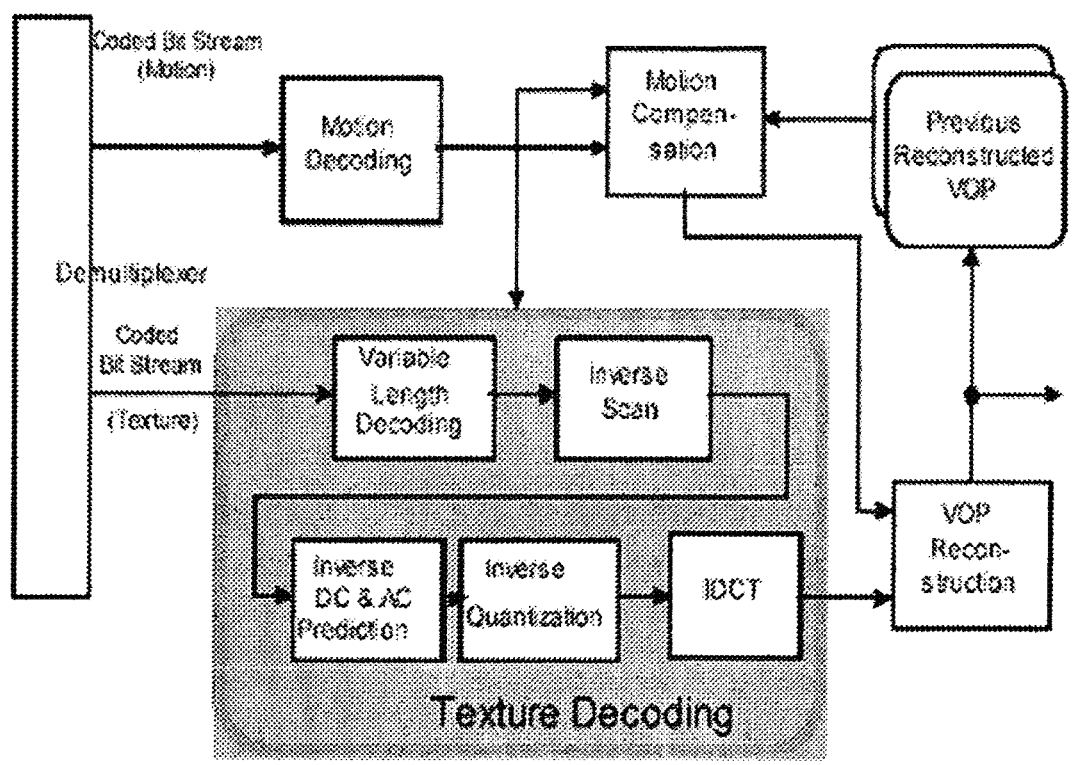
FIG. 6 is general diagram illustrating standard MPEG4 Simple Profile decoding steps which are followed in general for video decoding by the multimedia object players of FIG. 1.

FIG. 6 illustrates MPEG4 video decoding process as outlined by the MPEG-4 Committee for recovering video object planes (VOPs) data from the coded bit stream. These steps of video decoding are followed in general by the video decoding process of multimedia players 10 and 11. The decoding process is composed of three major sections: shape, motion, and texture decoding.

Coded Bit Streams: The video stream is parsed and demultiplexed to obtain shape, motion, and texture bit streams. Each stream has a decoding process needed in order to reconstruct the VOPs.

Shape Decoding: Binary shape decoding is based on a block-based representation. The primary coding methods are block-based context-based binary arithmetic decoding and block-based motion compensation.

Variable Length Decoding: Shape information, motion vectors, and the quantized DCT coefficients are encoded using variable length codes.

Differential DC coefficients in intra macroblocks are encoded as variable length codes. The final DC value is the sum of the differential DC value and the predicted value. The AC coefficients and non-intra block DC coefficients use a different variable length code.

Inverse Scan: Coefficients are scanned during the encoding process for two reason—to allocate more bits to high energy DCT coefficients during quantization and to turn the two dimensional array (8×8) into a one dimensional array. The reverse process (i.e. inverse scan) is used on the decoding size to ensure proper dequantization and to restore the two dimensional information. There are three types of scans used; Alternate-Horizontal scan, Alternate-Vertical scan, and the Zigzag scan. The type of scan used during the decoding process will depend on the type of coefficients being decoded.

Inverse AC and DC Prediction: The prediction process is only carried out for intra macro blocks. Previous intra macro blocks are used for forward prediction in order produce subsequent macro blocks. This optimization process is used to predict both DC and AC coefficients.

Inverse Quantization: The two-dimensional array of coefficients produced by the inverse scan is inverse quantized to produce the reconstructed DCT coefficients. The process is trivial; it is basically a multiplication by the quantizer step size. A variable quantizer step size can be produced by using a weighted matrix or a scale factor in order to variably allocate bits during the encoding/decoding process.

Inverse DCT (IDCT): An inverse DCT is applied in order to recover the VOP from the frequency domain (i.e. DCT coefficients) into the spatial domain (i.e. pixel values). Note that in the texture decoding process, the luminance and chrominance components of the VOP (i.e. Y, Cb, Cr components) are quantized at different rates in order to reach a higher compression rate (which is the powerful aspect of the DCT transform when used in compression).

Motion Decoding and Compensation: Motion compensation is another technique used to achieve high compression. The algorithm used by MPEG-4 is block-based motion compensation to reduce the temporal redundancy between VOPs. Motion compensation in this case is two fold: if is used to predict current VOP from previous VOP, and to interpolate prediction from past and future VOPs in order to predict bi-directional VOPs. Motion vectors must be decoded to predict movement of shapes and macroblocks from one VOP to the next. Motion vectors are defined for 8×8 or 16×16 regions of a VOP.

As exemplified by MPEG4 Simple Profile decoding diagram FIG. 6, but common to other video codecs, two types of Video Object Planes (VOP) are handled in digital video decoding. Video streams must begin with a frame that makes no temporal reference to any earlier frames or an Intra-Frame (I-Frame). A second type of VOP that allows temporal reference to the previous frame in the stream are known as Predicted Frames (P-Frames). Macroblocks within P-Frames may contain motion vectors to enable motion correction from the previous frame. These macroblocks often contain pixel residue information which includes corrections to the predicted pixels.

Motion compensation must occur for many of the macroblocks within P-Frames and is a critical component of any video decoding mechanism. Motion vectors can be compressed using Huffman codes. These are binary Variable Length Codes (VLC) which represent values occurring with high probability with shorter binary length than values which occur with less probability. The rapid decoding of VLCs is critical to any decoding application on constrained devices. The video decoding process operating on the multimedia object players 10 and 11, decodes these VLCs in a novel use of Huffman codebooks.

Theoretical Huffman codebook process reads bits from the packet bitstream until the accumulated bits match a codeword in the codebook. This process can be thought of as logically walking the Huffman decode tree by reading one bit at a time from the bitstream, and using the bit as a decision Boolean to take the 0 branch (left side) or the 1 branch (right side). Walking this binary tree finishes when the decoding process hits a leaf in the decision tree—the result is the entry number corresponding to that leaf. Reading past the end of a packet propagates the 'end-of-stream' condition to a decoder.

Figure 7:
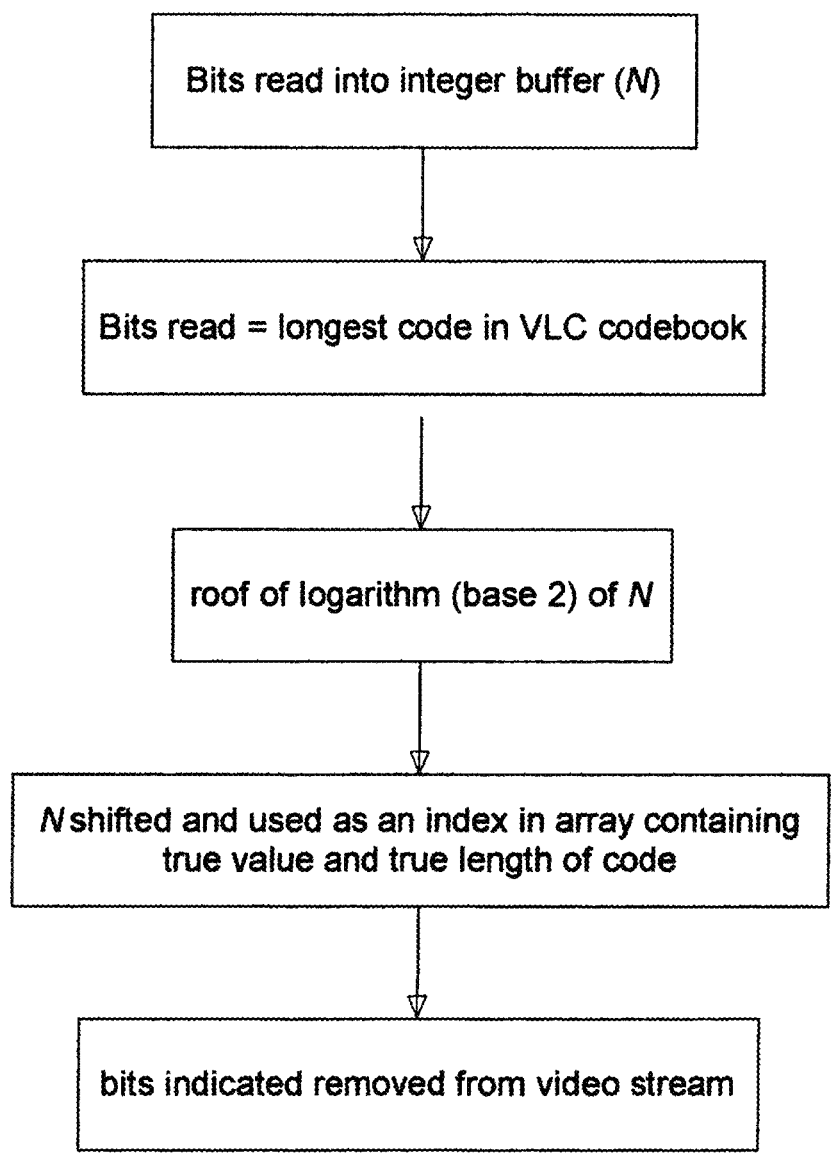
FIG. 7 is a flow diagram illustrating an optimized Huffman codebook method for digital video decoding method used by the multimedia object players of FIG. 1.

The novel approach taken to decode VLCs by the video decoding process operating on the multimedia object players 10 and 11, is illustrated in FIG. 7, and can be precisely described as follows:

Bits are read off the stream into an integer buffer (N). The number of bits read is equivalent to the length of the longest code in the VLC codebook. The roof of logarithm (base 2) of N is taken. Based on the result, N is shifted and used as an index into an array containing the true value indicated in the codebook and the true length of the code. The number of bits indicated as the true length is then removed from the video stream and processing continues. An example is provided:

Table B-7 of the MPEG4 Standard (Conf. [1]) contains the Code/Value(s) pair:
Code: 0000 0101 Values MBType: 2 CBPC: 0b11

The maximum length of a code in Table B-7 is 9. The above code would be read off the bit stream as (N:=)0000 0101X (where X is a 'Do Not Care' bit). The roof of logarithm (base 2) of N is found to be The value 4 is then used to identify the array in which N is used as an index to locate the appropriate decoded value. N can also be shifted to remove irrelevant bits allowing the lookup array to be smaller.

This novel approach provides a very low time complexity and due to the nature of Huffman codes, a great majority of codes can be decoded with the first few tables providing a greater cache hit ratio.

Figure 8:
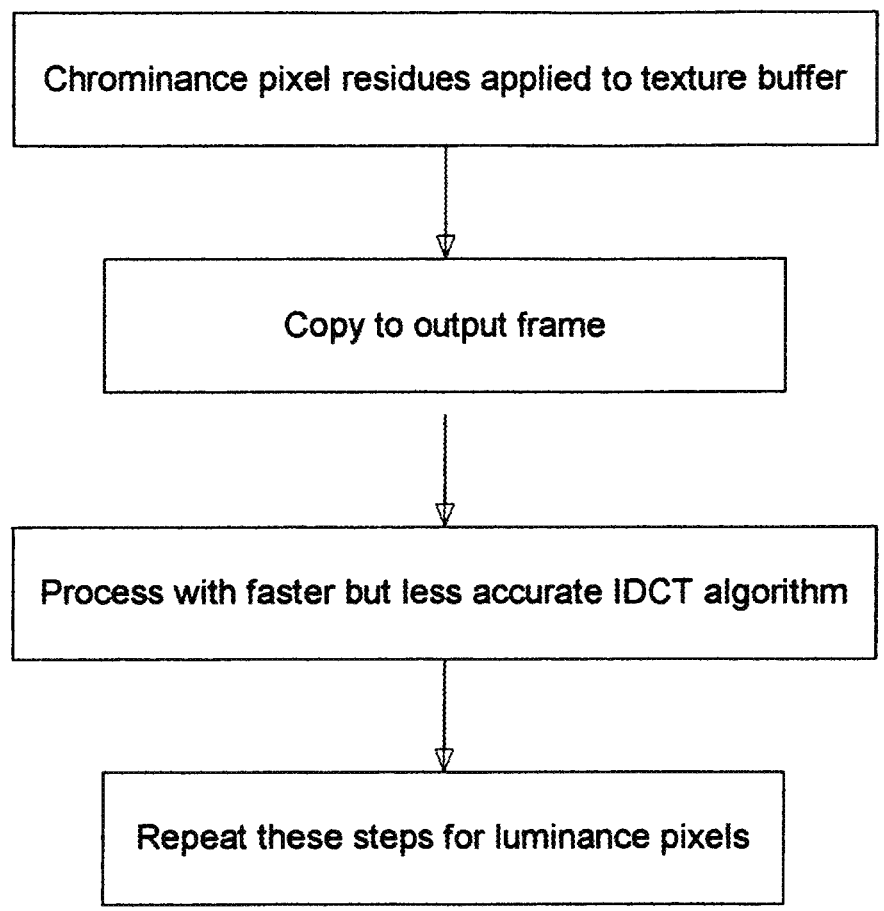
FIG. 8 is a flow diagram illustrating a method of using a texture buffer to process P-frames for digital video decoding.

Following the reading and processing of motion vectors off the video stream, motion correction must take place. Due to the high latency of memory often used in constrained devices, random memory access and non-contiguous memory access must be minimized. FIG. 8 is a flow diagram, describing video decoding process in the multimedia object players 10 and 11, which illustrates that a texture buffer large enough to contain 4 luminance and 2 chrominance blocks (the dimensions of a macroblock exemplified in the MPEG4 specification) is used to store the predicted pixels from a reference frame. This texture buffer is much smaller then the original video frame and decreases the amount of reading from and writing to non-consecutive bytes within the reference and output video frames. All pixel residues are applied to the texture buffer which is then copied to the output frame. This method of processing P-frames is optimal in situations where the main processing unit has sufficient cache to store the texture information of the entire Macroblock. In cases where the limited device has very little or no on-die cache, it may be preferable to avoid using a macroblock texture buffer. Also, macroblocks with motion vector information contain pixel residue values that are often distributed in a much smaller range of values than the pixels of a texture. In cases where the device is unable to decode the video stream in real-time, a faster but less accurate IDCT algorithm can be used to process these residue values. Furthermore, to minimize the effect of the less accurate IDCT algorithm, this step is taken first on chrominance pixel residues, but can also occur for luminance pixel residues as required.

Figure 9:
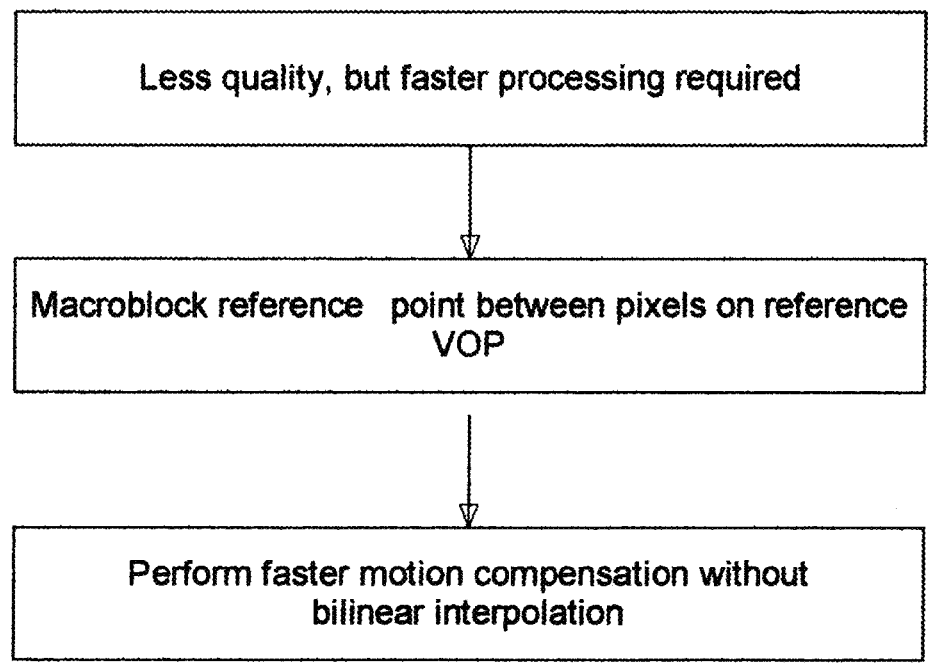
FIG. 9 is a flow diagram showing a method of video decoding performing faster motion compensation without bilinear interpolation when less quality but faster processing is required that is used by the multimedia object players of FIG. 1.

The motion vector information associated with a macroblock often references a point between pixels on the reference VOP. This requires that decoders perform bilinear interpolation between pixels. This is a time consuming process requiring the sampling of four source pixels, four additions and a single divide operation for every output pixel. In addition to various arithmetic optimizations performed the video decoding process of the multimedia object players 10 and 11, shown in the flow diagram of FIG. 9, uses faster motion compensation without bilinear interpolation when less quality but faster processing is required.

Digital video codecs define Luminance and Chrominance values within a given subrange of values, MPEG4 uses [0, 255]. This allows the decoding software to store the Luminance and Chrominance pixels within a single byte of data with the correct precision. However, during the decoding process, values outside the [0,255] are often generated during motion compensation and in the inverse DCT steps. Attempting to store values outside this range results in a single byte overflows causing graphical errors in the final video output. Clipping these values and modifications to the dequantization process can be very time consuming and can result in decrease of output correctness.

Figure 10:
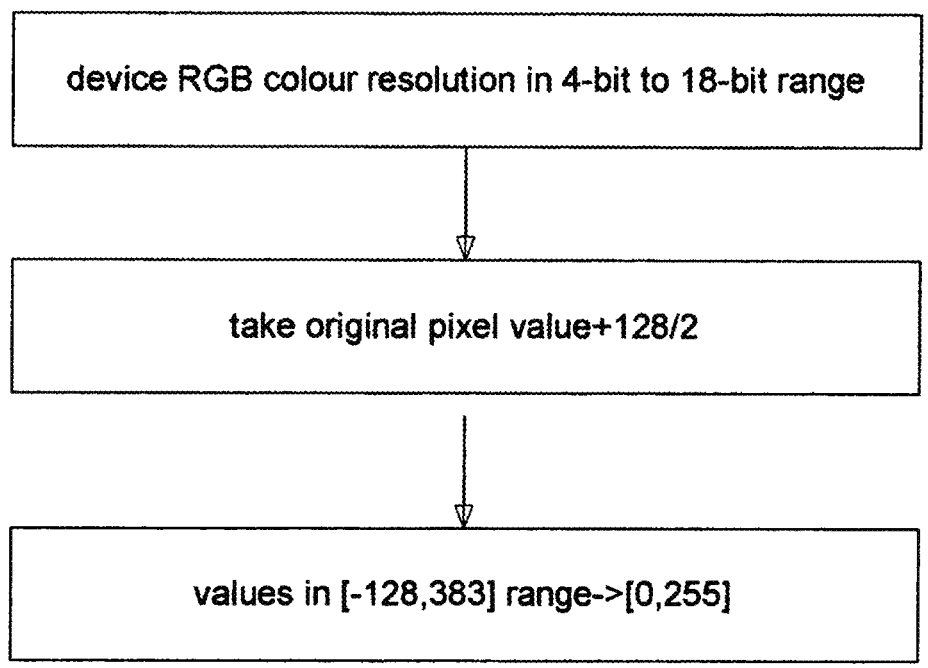
FIG. 10 is a flow diagram illustrating an optimized digital video decoding method for optimizations in pixel processing and dequantization used by the multimedia object players of FIG. 1.

FIG. 10 is a flow diagram illustrating novel optimization for the dequantization step of digital video decoding in the multimedia object players 10 and 11. The novel optimization requires the a reduction in pixel accuracy but allows values outside the range [0, 255] to be represented in a byte field without an overflow. Through analysis of various video samples, it has been found that the range [−128, 383] is sufficient to store nearly all potential resulting Luminance and Chrominance pixel values. By taking the original pixel value, adding 128 to it and dividing the result by two, values in the [−128, 383] may be represented in the [0, 255] with a decrease in accuracy of 50%.

This decrease in luminance and chrominance accuracy is not a factor on many limited devices as the RGB color resolution is often in the 4-bit to 18-bit range. As an example an input pixel (nInputPixel) in the range [−128, 383] is converted into the alternate format for storing in a byte field (nbOutputPixel): byte nbOutputPixel=(nInputPixel+128)/2.

Figure 11:
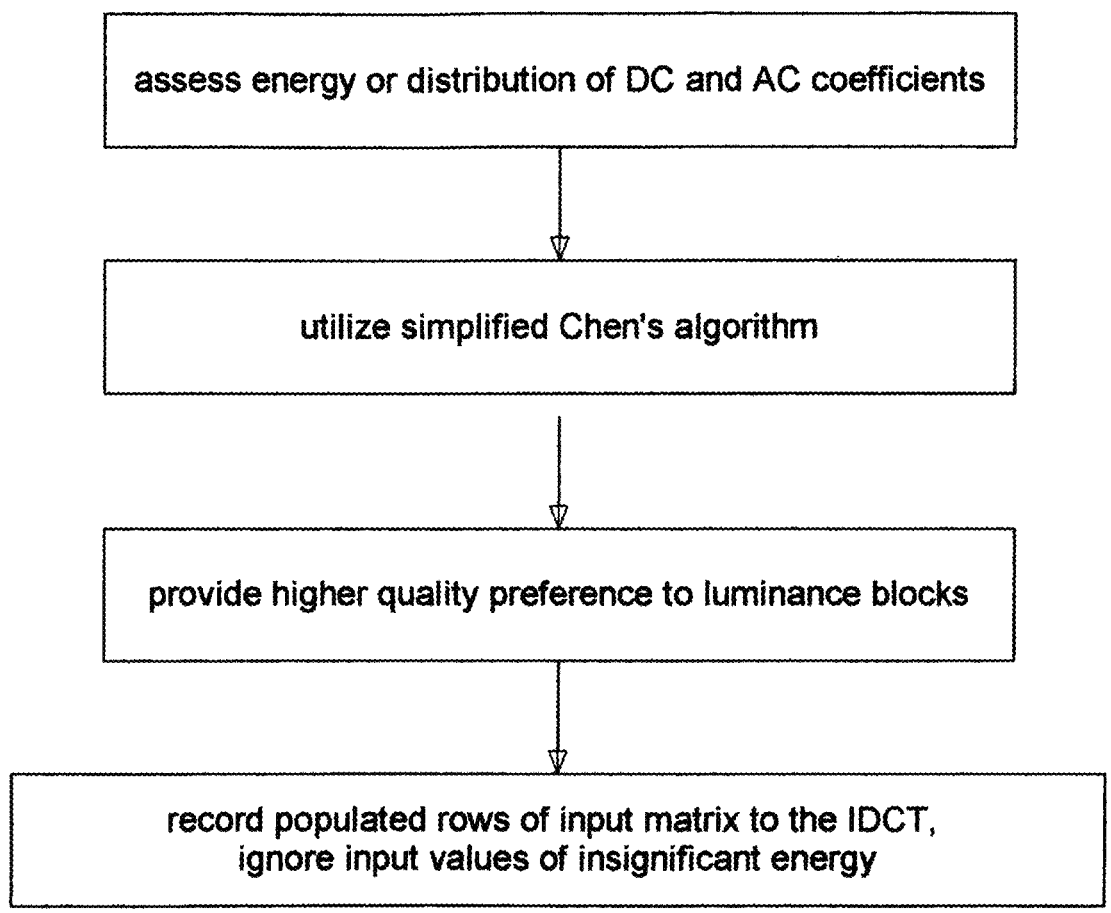
FIG. 11 is a flow diagram illustrating a novel use of Chen's algorithm used by the multimedia object players of FIG. 1.

One of the most processing intensive steps of the decoding process occurs during the IDCT step. The use of an effective integer-based algorithm is an absolute requirement when the decoding occurs on constrained devices. The Chen's IDCT algorithm is optimized, but the processing time consumed by the standard Chen implementation is to great for real-time decoding on limited devices. Hence, FIG. 11 is a flow diagram illustrating a novel use of Chen's algorithm in the multimedia object players 10 and 11. Here several different simplified versions of Chen's algorithm be implemented, based on the energy or distribution of input DC and AC coefficients. This can result in reduced video output quality, but the effect is mitigated by giving a higher-quality preference to luminance blocks. Reduced color definition is often not as noticeable on constrained devices, and allows the chrominance blocks to be decoded with less precision. The IDCT process can be further optimized by recording which rows of the input matrix to the IDCT are populated with values. This same mechanism can be used to ignore certain input values of insufficient energy to make a very noticeable impact on the output image and further decrease processing time.

Figure 12:
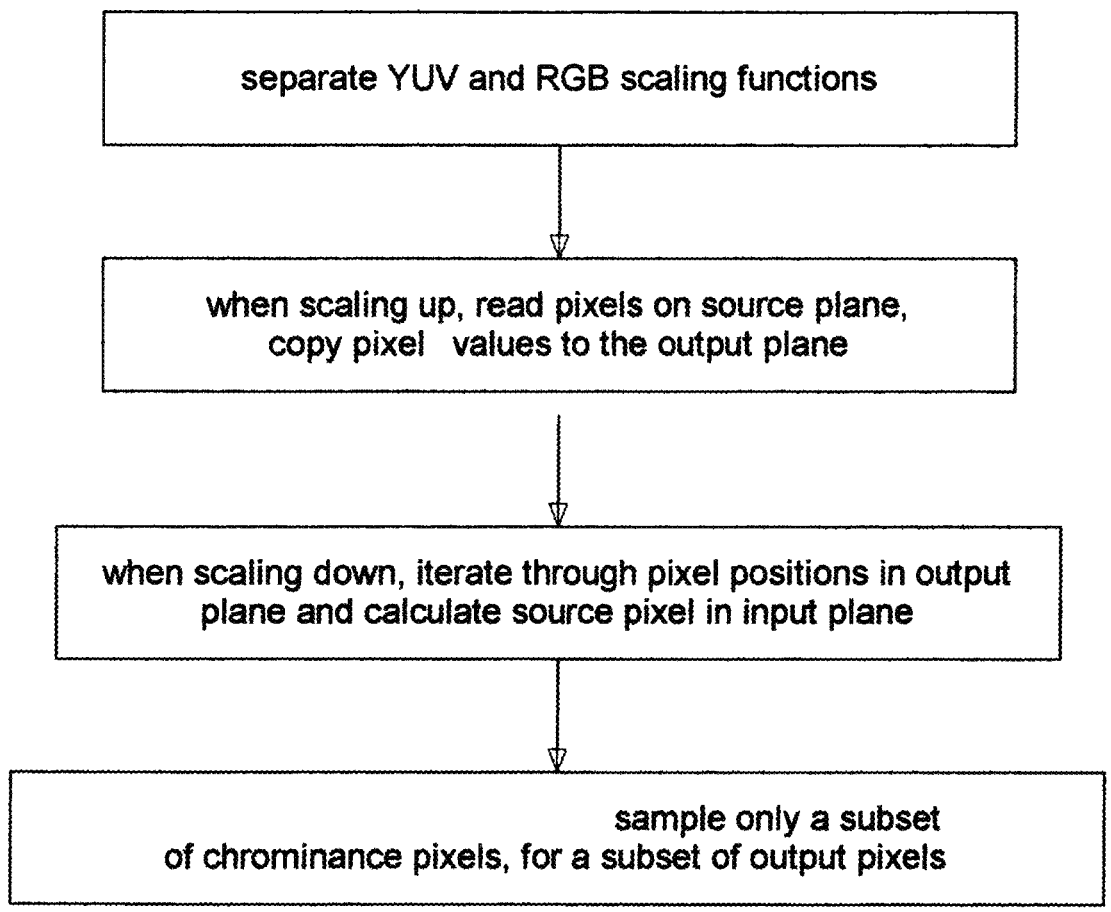
FIG. 12 is a flow diagram showing a novel handling YUV to RGB conversion used by the multimedia object players of FIG. 1.

In a limited device, the memory access required in the YUV to RGB conversion process can be sufficiently long to consume more time then any other step in the video decoding process. The video decoding process in the multimedia object players 10 and 11 uses a further step of scaling to reduce this processing, as the display size is often not the exact size of the video output. The YUV to RGB conversion and scaling steps can be combined into a single step to decrease memory access and increase the speed of video output. Several YUV to RGB functions are available providing decoding times of varying speeds and quality as well as scaling ranges. FIG. 12 is a flow diagram showing video decoding of the YUV to RGB step in the in the multimedia object players 10 and 11, as follows:

1) Separate YUV to RGB and scaling functions for cases where scaling up is required and where scaling down is required. Distinct optimizations are available for each method and added speed can be attained by separating the functionality between several different functions.

2) When scaling up is required, a minimum amount of reading from the source Luminance and Chrominance planes is desired. This is accomplished by iterating through pixels in the source plane. A fixed number of Luminance and Chrominance values in a column are read and the resulting RGB values computed for each pixel position. The pixel values are then copied in a looping fashion first by column, then by row to the output plane. This provides a way to read a single input value which may result in many output values in the output plane when scaling up.

3) Similarly, when scaling down is required a minimum amount of reading from the source Luminance and Chrominance planes is desired. This is accomplished by iterating through pixel positions in the output plane and calculating the source pixel in the input plane. This provides a way to read a single input value for every output value and minimizes the number of input-plain reads that are necessary.

4) The YUV to RGB conversion step is such a time consuming one that methods of improving the speed of computation at the expense of output quality have been implemented. Improvements in speed can be obtained by sampling only a subset of the chrominance pixels, avoiding pixel clipping or calculating the Red and Blue values for only a subset of output pixels. All of these methods are used together to provide several quality levels in the YUV to RGB step.

Figure 13:
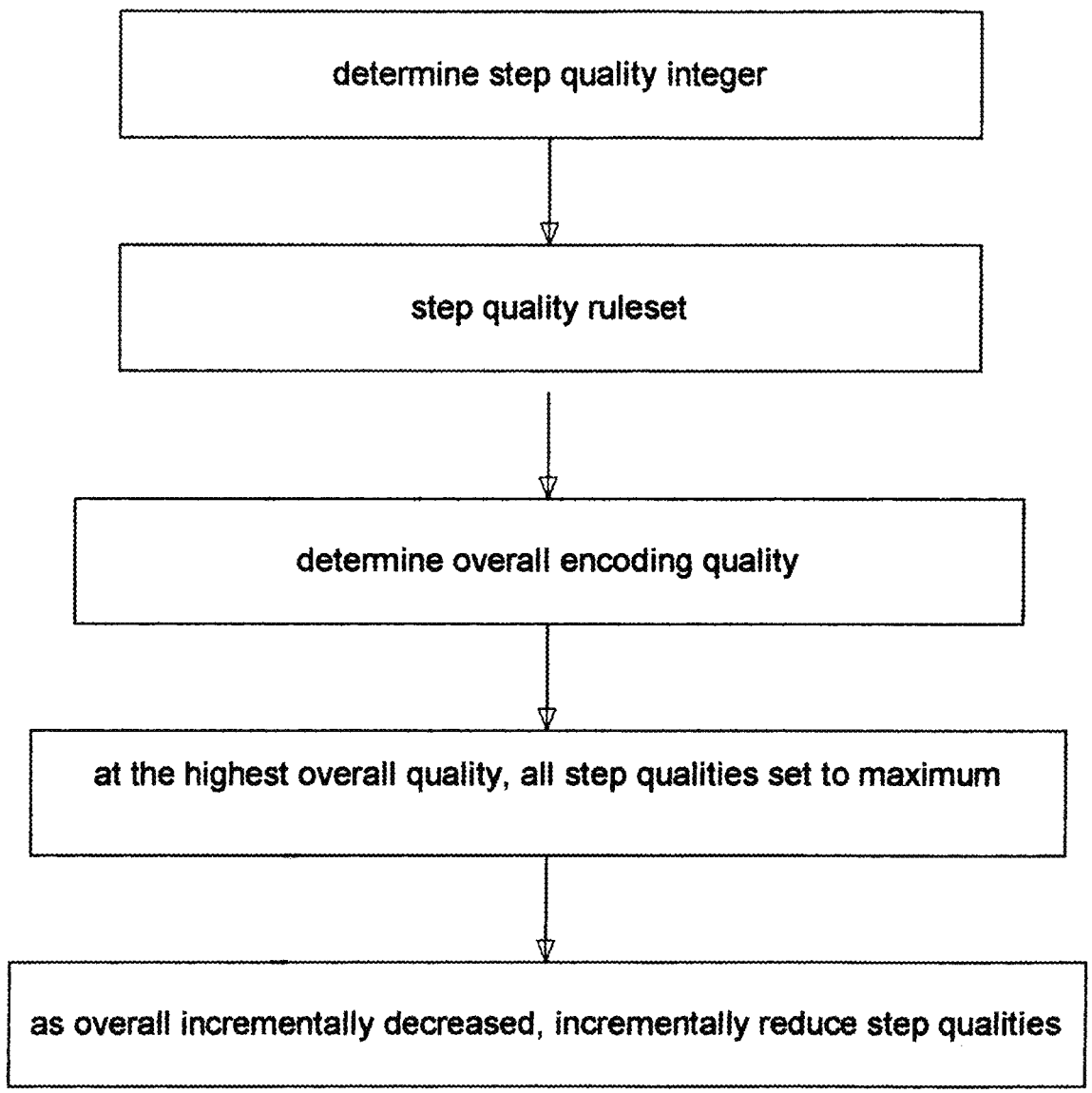
FIG. 13 is a flow diagram illustrating decoding short cuts for effective video decoding on variable limited mobile client hardware used by the multimedia object players of FIG. 1.

Hence, FIG. 13 is a flow diagram summarizing the short-cut optimization processing by the video decoding process used in the multimedia objects players 10 and 11. State information is maintained about the quality levels with which the current video stream is processed. On very limited devices short-cuts in the decoding process must be made to allow the device to maintain synchronicity between the audio and video playback. These short-cuts are specifically designed to drastically reduce the number of computations necessary at certain critical steps in the video decoding process at the cost video output quality. This mechanism allows video decoding to scale in complexity based on the processing power of the device being used.

It has been found that three quality levels tests at each critical step appear to yield the best results. The highest quality is consistent with the video codec specification and displays a correct image. A medium quality level indicates that certain time consuming short-cuts are made with some impact on image quality. A low quality level indicates that drastic reductions in display quality are made to improve processing time—the output video can be unrecognizable at times and as a result this level is used only in drastic cases of a sudden drop in processor availability.

A final option exists is to avoid the processing and displaying of some or all P-Frames. This is only an option in video streams where I-Frames occur at regular intervals. Given the wide variety of processing capabilities in limited devices, this implementation strongly suggests the creation of multimedia objects from video streams with transcoder 2 specifying very regular I-Frames so that devices of very limited processing power are able to provide the client 8 with occasional frame changes.

The state information is composed of a series of integers correspond to various steps in the decoding process and define the quality at which the decoder should perform several steps. The implemented system in the multimedia players 10 and 11 consists of six of these integers:

nYUVtoRGBQuality—Quality of the YUV to RGB conversion process nLumaIDCTQuality—Quality of the Inverse DCT function for Luminance blocks nChromaIDCTQuality—Quality of the Inverse DCT function for Chrominance blocks nLumaMCQuality—Quality of motion compensation for Luminance blocks nChromaMCQuality—Quality of motion compensation for Chrominance blocks nFrameRateQuality—Defines the allowance to drop frames (from a single P-Frame occurring before an I-Frame up to dropping all P-Frames)

In addition to the set of integers defining the actual quality at various steps, a single integer representing the current quality level of the overall decoding is used (named nVideoQuality in this instance). Each step quality has a very limited number of possibilities (HIGH, MEDIUM, LOW, etc), however, nVideoQuality can take on many values. At each value of nVideoQuality, a ruleset defines quality of each of the above step qualities. At the highest value of nVideoQuality, all step qualities are set to maximum. As an nVideoQuality is decreased, the step qualities are incrementally reduced according to the ruleset.

Some states of quality levels are less preferable to others. For example, it is not preferable to render many frames at the lowest quality setting of nLuminaIDCTQuality—it is instead more preferable to drop frames if there is insufficient processing capability to perform nLumaIDCTQuality at a higher quality. The ruleset is designed to take these possibilities into account.

Figure 14:
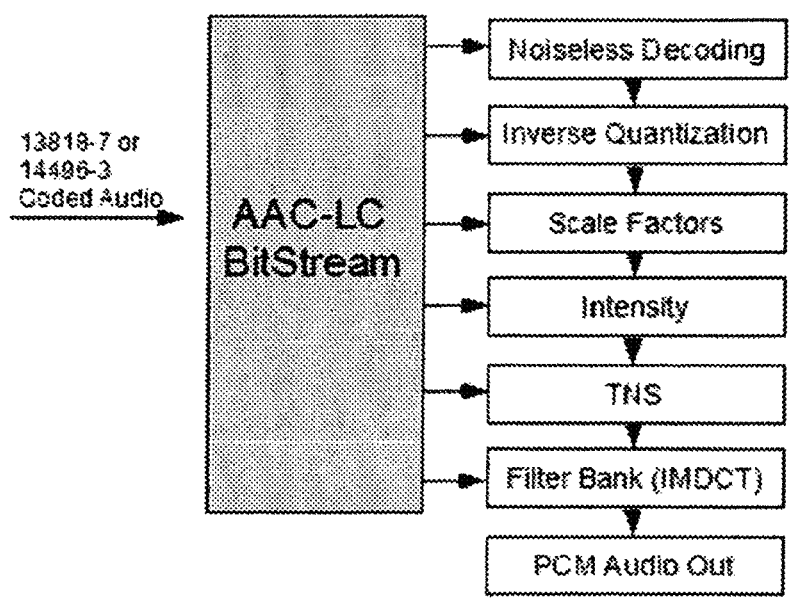
FIG. 14 is a general diagram illustrating basic steps of the AAC digital audio decoding and other similar audio codec decoding, which are followed in general by the multimedia object players of FIG. 1.

FIG. 14 illustrates the general steps of audio decoding followed by the audio decoding process of the multimedia object players 10 and 11.

The first step in AAC audio decoding (bit-stream de-multiplexing), which is common to other digital codecs, is to establish frame alignment. This involves finding the AAC sync word and confirming that the AAC frame does not contain any errors, if error checking is enabled in the frame. Once the frame sync is found, the bitstream is de-multiplexed or unpacked. This includes unpacking of the Huffman decoded and quantized scale factors, the M/S synthesis side information, the intensity stereo side information, the TNS coefficients, the filter bank side information and the gain control words.

Next the quantized spectral coefficients are Huffman decoded. Each coefficient must be inverse quantized by a 4/3 power nonlinearity and then scaled by the quantizer step size.

Figure 15:
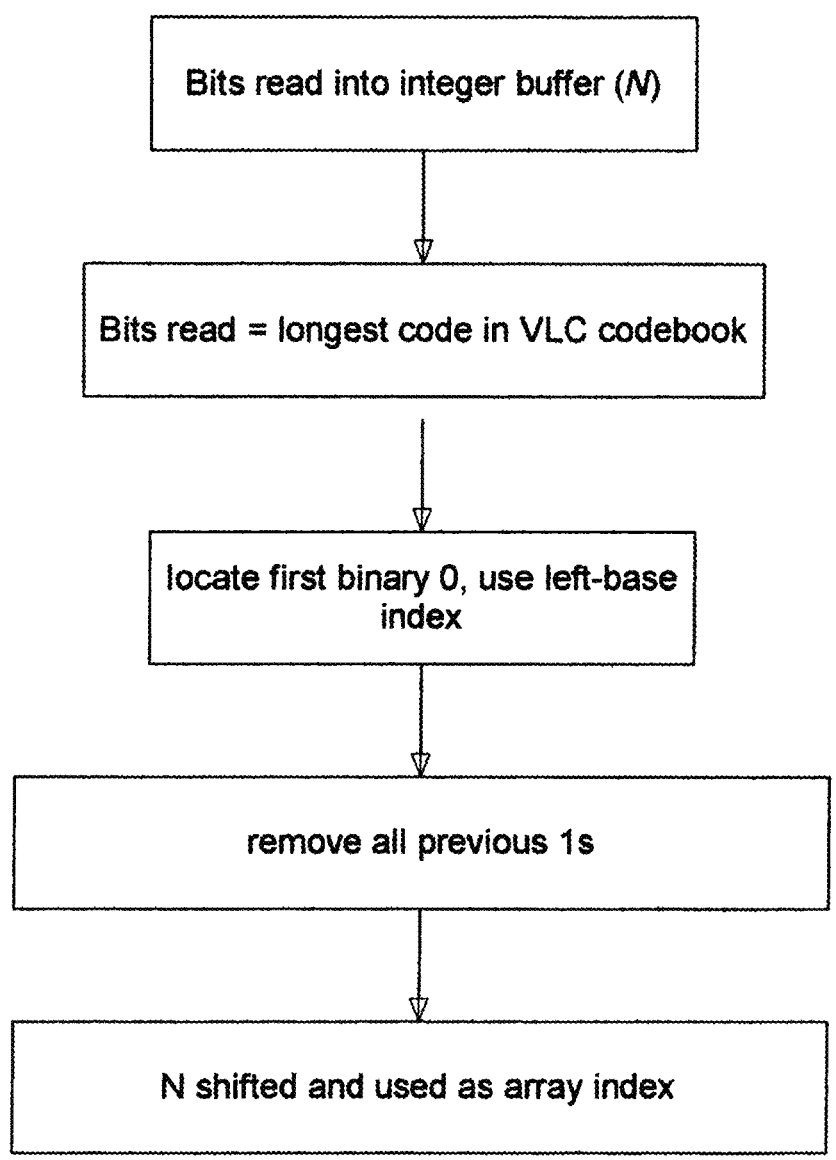
FIG. 15 is a flow diagram illustrating an optimized Huffman codebook method for digital audio decoding used by the multimedia object players of FIG. 1.

The Huffman codebooks used to decode digital audio in the multimedia object players 10 and 11 of FIG. 1, are very different from those used for digital video, but they are very similar to Huffman codebooks used in other digital audio codecs. A novel simplification of variable length fields (VLCs), used in audio decoding by the multimedia object players 10 and 11, is illustrated in FIG. 15, that allows the decoding of a single VLC value with a single array lookup. The novel approach taken is as follows:

Bits are read off the stream into an integer N. The number of bits read is equivalent to the maximum number of bits in the longest codeword in the codebook. The first binary 0 is then located starting from the highest bit. The left-based index of this first 0 is then used to remove out all the previous 1s and N is shifted and used as an array Index.

For example, the AAC standard's 2nd Codebook contains the Code/Value pair:
Code: 11110110, Value: 77

The maximum length of a code in the 2nd table is 9 so when read from the BitStream the above code would appear as:
11110110X (Where X is a "Do Not Care" bit)

The ZeroPosition of the above integer is found to be 4. The ZeroPosition is then used to mask off the 1 bits previous to it yielding the integer "0101X". This can then be used as an index to an array or be shifted to remove the irrelevant bits allowing the lookup array to be smaller.

The next standard audio decoding step, M/S synthesis, conditionally dematrixes two channels into a stereo pair. The samples my already represent the left and right signals, in which case no computation is necessary. Otherwise the pair must be de-matrixed via one add and one subtract per sample pair in order to retrieve the proper channel coefficients.

Intensity stereo identifies regions in a channel pair that are similar, except for their position. Left-channel intensity regions must have inverse quantization and scaling applied. Right-channel intensity stereo regions use the left-channel inverse quantized and scaled coefficients, which must be re-scaled by the intensity position factors. Hence the net complexity of intensity stereo is a savings of one inverse quantization per intensity stereo coded coefficient. The next standard step, temporal noise shaping (TNS), has a variable load, depending on the number of spectral coefficients that are filtered.

Finally, the Inverse Modified Discrete Cosine Transform (IMDCT) transforms the spectral coefficients into time-domain samples. For fixed-point implementations it is required that any round-off noise is less than ½ LSB after the transform result is rounded to linear 16-bit values. Fixed-point realizations using 24 bit words are sufficient.

Figure 16:
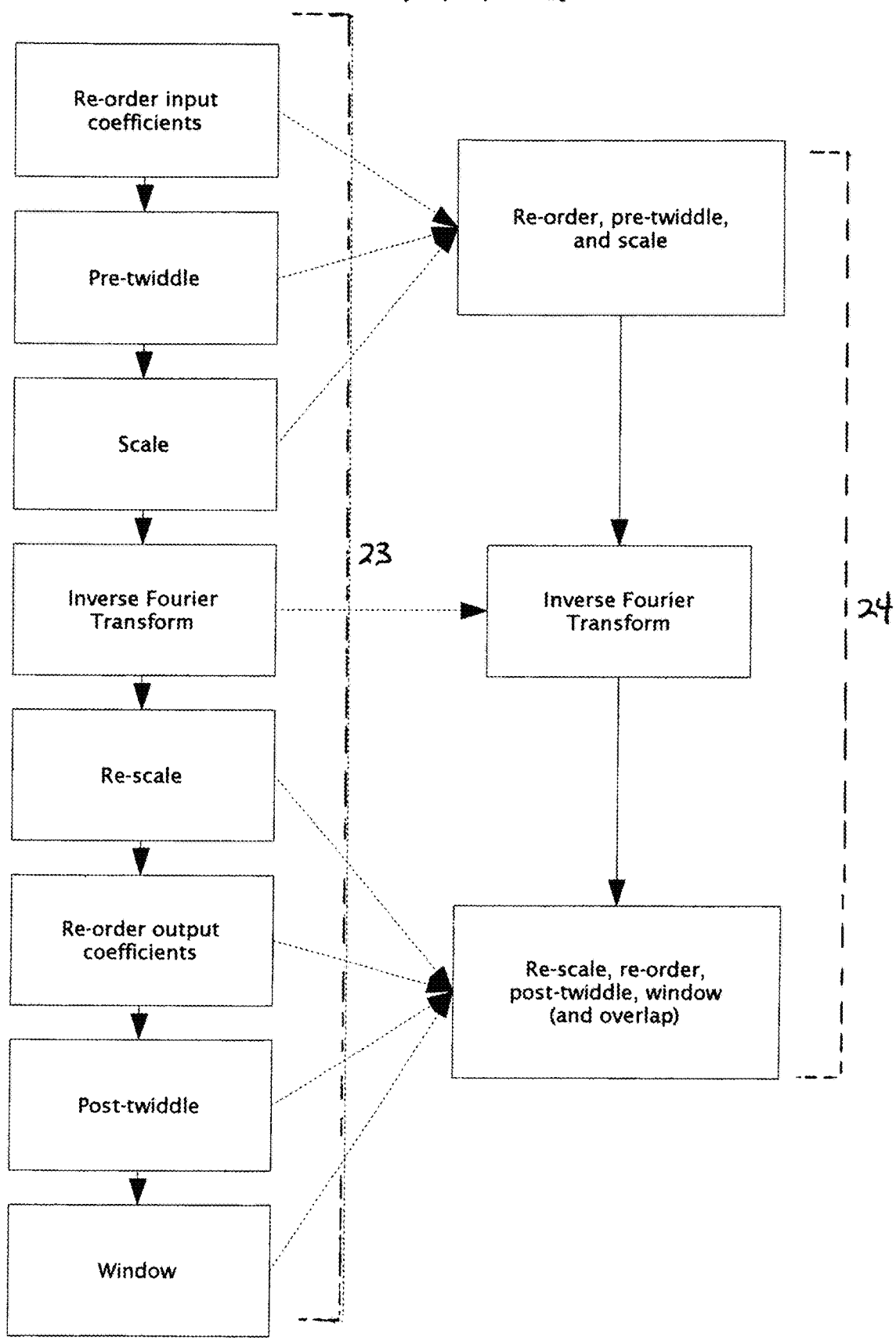
FIG. 16 is a flow diagram illustrating an optimized digital audio decoding method for optimizations in the IMDCT step used by the multimedia object players of FIG. 1.

FIG. 16 illustrates Intermediate 23 and Final 24 optimizations for the digital audio IMDCT step used by the audio decoding process in the multimedia object players 10 and 11. The audio decoder of the multimedia object players 10 and 11, combines the use of a specific Inverse Fast-Fourier Transform with Pre- and Post-processing steps.

This method produces a simplified IMDCT algorithm with $O(n*\log(n))$ runtime. This method can also incorporate the use of various IFFT algorithms based on the sparseness of input.

The following the steps describe the implementation:

[0] The IMDCT algorithm accepts an input array X of spectral coefficients in the frequency domain and outputs an array of amplitude values in the time domain twice the size of the input. The implementation of the AAC Low Complexity codec requires that the IMDCT algorithm accept input array lengths of 128 or 1024 Real values and results in an output of 256 or 2048 Real values. In the following steps, N refers to the size of the output (256 or 2048), Im(X) returns the imaginary component of some variable X and Re(X) returns the real component.

[1] The (N/2) input spectral coefficients are converted into complex numbers and stored into an array C of size (N/4). There are many approaches to this step, however, the approach taken in the described implementation pairs coefficients with one coefficient becoming the real component and one becoming the imaginary component of a complex number. The following pseudo code describes this step:

```
for (n = 0; n<N/4; n ++) {
    Re(C[n]) = X[N/2 - 2*n];
    Im(C[n]) = X[n];
}
```

[2] This result is then multiplied with scaled complex numbers on the unit circle yielding an array of size N/4. This step is described with the following pseudo code:

```
for (n = 0; n<N/4; n ++) {
    Re(Z) = SQRT(2/N) * cos(2*Pi*(n + 1/8) / N)
    Im(Z) = SQRT(2/N) * sin(2*Pi*(n + 1/8) / N)
    Re(C[n]) = Re(C[n]) * Re(Z) - Im(C[n]) * Im(Z);
    Im(C[n]) = Re(C[n]) * Im(Z) + Im(C[n]) * Re(Z);
}
```

[3] The resulting array of complex numbers is then passed into an Inverse Fast Fourier (IFFT) Algorithm. A fixed-point IFFT algorithm is used to allow processing of IMDCT on devices which lack floating point capabilities. Most mobile devices do not allow floating point computations, and of those that do allow floating point, it is usually too slow.

Due to the properties of the inverse Fourier transformation, the transformation can be calculated in a fixed point manner. In a fixed point transformation, the input is be scaled by multiplying the input values by a scale factor and then the correct output is found by multiplying by the reciprocal of the scale factor. Therefore a scaling operation is applied before and after the IFFT. A scale factor which is a power of two is chosen so that the scaling and re-scaling operations can be accomplished by bit shift operations. Bit shifts are among the fastest operations for CPUs.

[4] Following the Inverse FFT step, elements from the complex array C must again be multiplied by complex numbers as in step [2].

[5] The values from the resulting complex array C are then stored into an array of Real numbers x of size N. The following pseudo code demonstrates the process:

```
for (k=I; I<N/8; I+=2) {
    x[2*I ] = Im(C[N/8+I]);
```

-continued

```
            x[2*I+1]       = Re(-C[N/8-1-I]);
            x[2*I+2]       = Im(C[N/8+1+I]);
            x[2*I+3]       = Re(-C[N/8-2-I]);
            x[2*I+N/4 ]    = Re(C[I]);
            x[2*I+N/4+1]   = Im(-C[N/4-1-I]);
            x[2*I+N/4+2]   = Re(C[I+1]);
            x[2*I+N/4+3]   = Im(-C[N/4-2-I]);
            x[2*I+N/2 ]    = Re(C[N/8+I]);
            x[2*I+N/2+1]   = Im(-C[N/8-1-I]);
            x[2*I+N/2+2]   = Re(C[N/8+1+I]);
            x[2*I+N/2+3]   = Im(-C[N/8-2-I]);
            x[2*I+N/2+N/4 ] = Im(-C[I]);
            x[2*I+N/2+N/4+1] = Re(C[N/4-1-I]);
            x[2*I+N/2+N/4+2] = Im(-C[I+1]);
            x[2*I+N/2+N/4+3] = Re(C[N/4-2-I]);
    }
```

As can be seen in FIG. 16, several steps in the IMDCT process can be combined. The goal of combining steps is to reduce the number of memory accesses needed to decode a frame of audio. The flow on the right shows the steps as they occur in the decoder.

In summary then, the novel optimization of the IMDCT step in audio decoding shown by FIG. 16 pertains to combining steps on the Final 24 optimization side:

1. Re-order, pre-scale and twiddle: The method loops over the input data, and each datum is complex-multiplied by the twiddle factor, and is then re-scaled by doing a bit shift operation. However, the twiddle factor is already bit-shifted so it can be treated as a fixed-point number, so the scaling operation's bit shift is partially performed by the twiddle factor itself. The relevant twiddle factors are stored in an array table. Once the complex multiplication and scaling are done, the resulting values are stored in the re-ordered location in the IFFT input array.

2. Perform the fixed-point integer inverse Fourier transform. This transformation is the same as the transformation in the pre-combined flow.

3. Re-scale, re-order, post-twiddle, window and overlap: Combining these four operations into one step replaces four array accesses with one, and some of the multiplications are also combined into single bit shifts. This method loops over the IFFT output array, and performs four operations in each iteration of the loop: the post-twiddle and rescale are combined, because the post-twiddle uses a twiddle factor table which is already bit-shifted. Windowing is combined in this step also, with window values coming from either a table or a fast integer sine calculator. Finally, values are overlapped and stored in the correct location in the output array.

Figure 17:
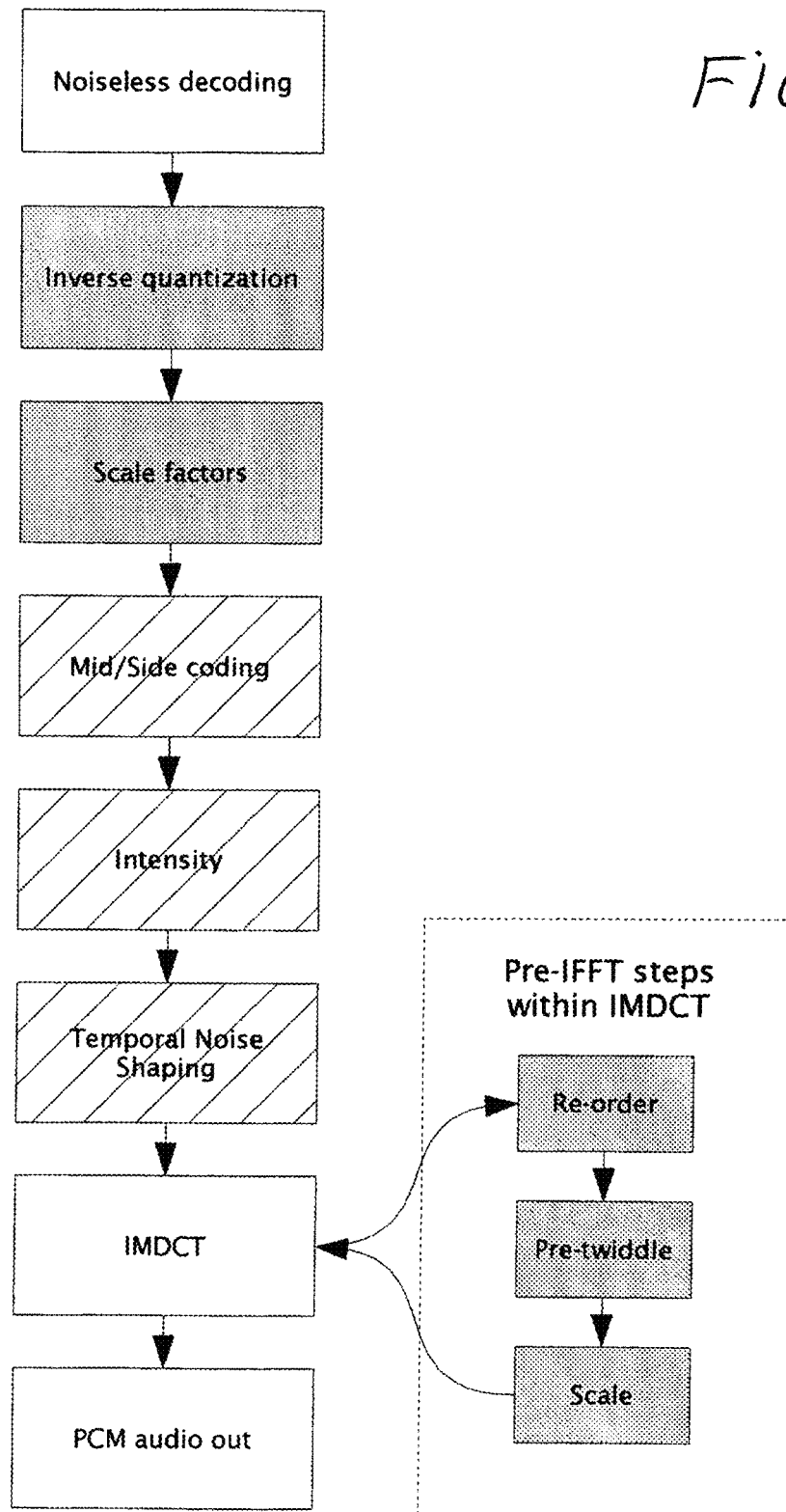
FIG. 17 illustrates simplified input short-cut processes specific to AAC Low Complexity (LC) audio decoding profile used by the multimedia object players of FIG. 1.

FIG. 17 illustrates simplified input shortcut processes that are specific to AAC Low Complexity (LC) profile which are used in the audio decoding process of multimedia players 10 and 11. Note, that the Mid/Side, Intensity and Temporal Noise Shaping steps, marked with cross hatches above, are optional. In cases where these three features are not present, audio decoding can further combine other steps in a novel way. These steps are marked in grey in FIG. 17. If these other steps are combined, there are no dependencies within a frame until we reach the IFFT step within IMDCT itself. Therefore operations between noiseless decoding and the pre-IFFT operations within IMDCT itself are combined, minimizing memory access.

IMDCT has four different window shapes which are common in other digital audio codecs: long only, long start, long stop, and eight short. Of these four window sequences, only one (long only) has non-zero data in the entire output synthesis window. In the case of AAC, however, the output synthesis window always has 2048 output values.

| Window shape | Non-zero byte range |
| --- | --- |
| LONG ONLY | 0-2047 |
| LONG START | 0-1599 |
| LONG STOP | 448-2047 |
| EIGHT SHORT | 448-1600 |

For some window shapes, the calculations can be short-cut, avoiding the post-twiddle, windowing, re-ordering, scaling and overlapping steps entirely.

IMDCT permits two different window types: Kaiser-Bessel Derived (KBD) windows and Sine windows. KBD uses a complicated formula which cannot be computed in real-time, and is always used as a table. Sine windows are also used from tables in most implementations.

However, on a mobile device, which generally has a very small on-CPU memory cache, frequent accesses to a sine window value table will cause cache misses and degraded performance.

Figure 18:
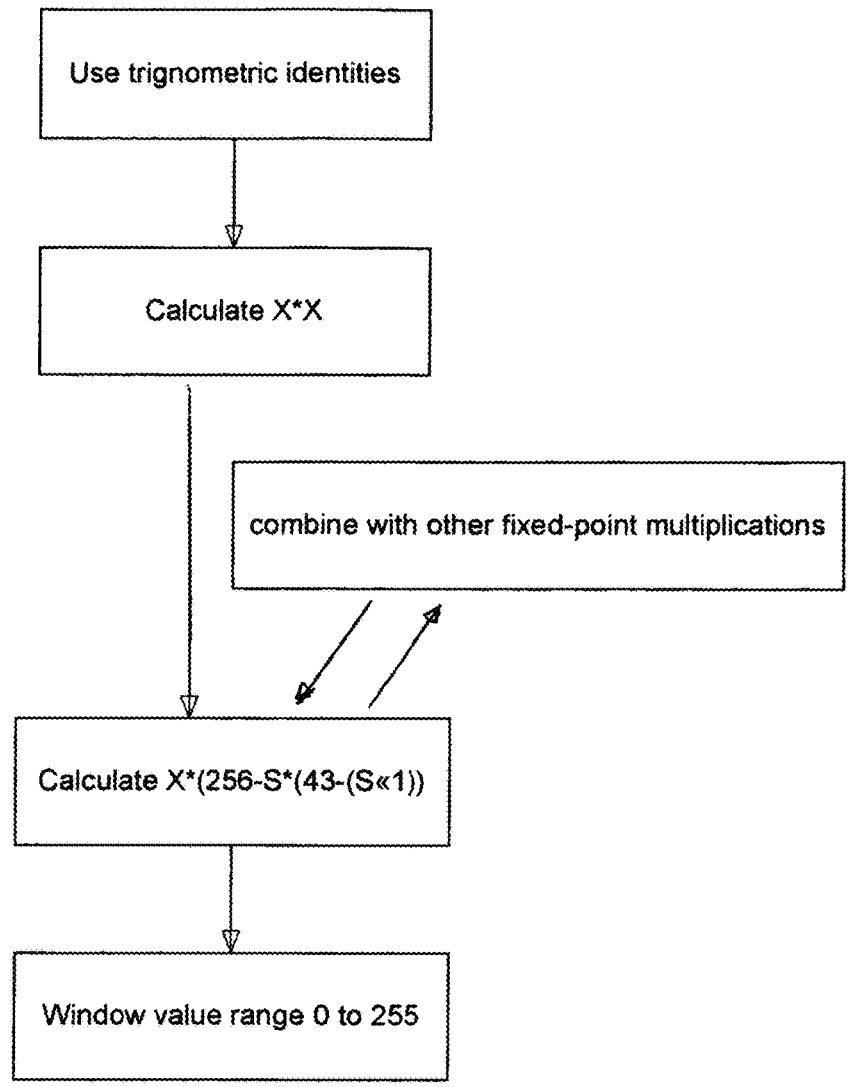
FIG. 18 shows audio decoding using an alternative bit-operation based Taylor computation method used by the multimedia object players of FIG. 1.

As an alternative to using a sine lookup table to compute windowing, the FIG. 18 shows the audio decoder of the multimedia objects players 10 and 11, using a bit-operation based Taylor computation, as follows:

1. Use trigonometric identities to express the sine calculation in terms of a sine in the range of 0 to n/2. Call the resulting angle X.
2. Calculate X*X. Call this value S.
3. Calculate the result as X*(256−S*(43−(S<<1))
4. The result produces a window value in the range of 0 to 255, allowing fast windowing without the use of lookup tables.
5. The bit shift operations in Step 3 can be further combined with other fixed-point multiplication steps.

Figure 19:
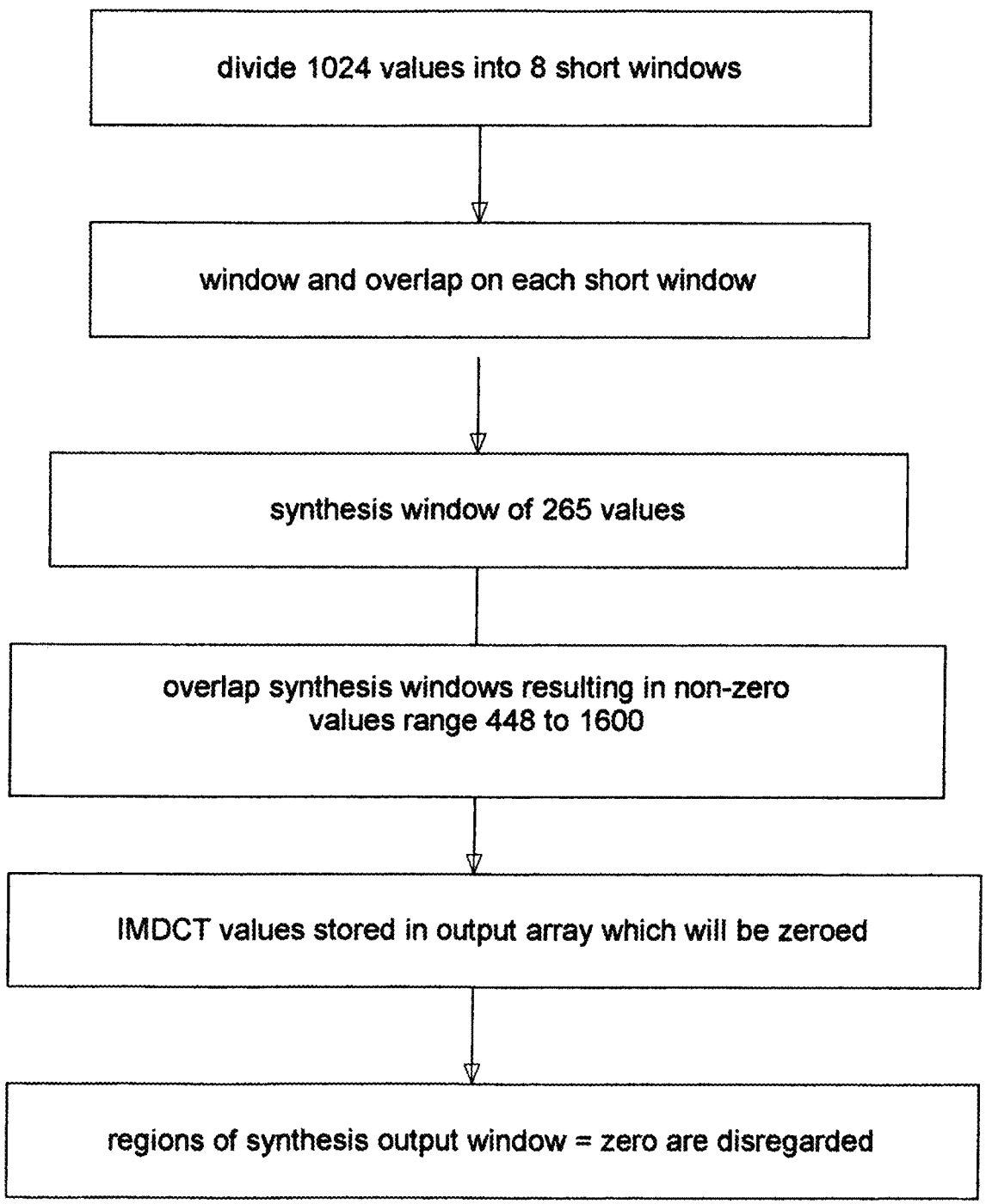
FIG. 19 illustrates further IMDCT short window processing for digital audio decoding for the method used by the multimedia object players of FIG. 1.

FIG. 19 is illustrates further IMDCT short window processing for even greater efficiency by the audio decoding process of multimedia players 10 and 11. In a sequence of eight short windows, the input of 1024 values is divided into eight short windows of 128 values, and IMDCT, windowing and overlapping is performed on each of these short windows. Each window of 128 values results in a synthesis output window of 256 values. These are then overlapped, resulting in non-zero values in the range of 448 to 1600.

The approach taken is to do every one of the IMDCT operations in sequence, rather than in parallel, storing the IMDCT results directly into the regions of the output array which will be zeroed. The output values are then windowed and overlapped. After all the eight short windows are completed, the regions of the synthesis output window which are always zero can be disregarded, due to the window shape shortcut method described above.

Figure 20:
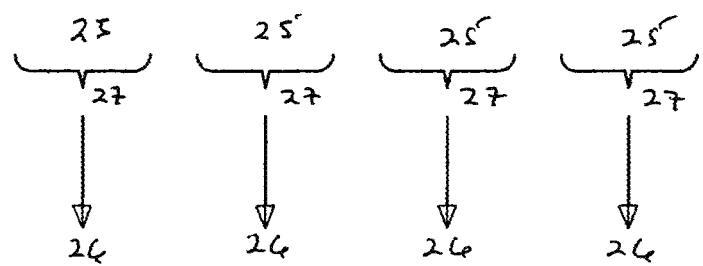
FIG. 20 illustrates low energy gap timing in audio playback for the method of audio decoding used by the multimedia object players of FIG. 1.

Finally, FIG. 20 illustrates an interleaved detection process in the audio decoding of received multimedia objects 25 by the multimedia object players 10 and 11. FIG. 20 illustrates the placement of gaps 26 at detected frames of low total energy 27 are they are detected during audio decoding by the multimedia object players 10 and 11. Hence, playback is then controlled so that the gap will occur during that frame, which may be dropped, so that synchronization with video is not lost.

In FIG. 1 the multimedia object player 10 is a downloadable Java (J2M2) applet and the described audio and video decoder optimizations and strategies, FIGS. 7-13 and FIGS. 15-20, as applied to standard MPEG4 and AAC decoding make it possible for the multimedia object player 10 to playback live music and video, at acceptable frame rates (5-15 fps), on limited, cell phone handsets. Java cannot take advantage of hardware capabilities in processing the huge number of calculations and variables required for either MPEG4 decoding or AAC decoding. Hence, the required optimizations for multimedia player 10, to permit the playback of AAC and MPEG4 on current mobile client hardware, are a source of technological innovation and advance.

The foregoing is intended, along with the drawings, to illustrate the preferred embodiment of the invention. Those skilled in the art will be able to devise numerous arrangements which, although not explicitly shown or described herein, embody the principles of the invention and are within their spirit and scope as defined by the following claims.

What is claimed is:

1. A method comprising:
    receiving audio and video segments encoded in a digital encoding format and with an encoding rate; wherein, said audio and video segments are associated with object parameters and supplied host path identification to form multimedia objects;
    requesting by a multimedia player, transmission of said multimedia objects; wherein said multimedia objects are located using http and received by said multimedia player from servers using a wireless connection;
    playing back received multimedia objects by the multimedia player, wherein the multimedia player is configured to play multimedia objects in a sequence such that fluidity, video quality and audio quality are maintained by selecting a plurality of said multimedia objects that reflect available network bandwidth, autonomously adjusting said selection and playback according to the multimedia object parameters and supplied host path identification, and by
    utilizing optimized decoding processes to maintain quality playback.

2. The method of claim 1, wherein the transmission of the multimedia objects is carried out by protocols that can serve files in a directory.

3. The method of claim 1, wherein the multimedia objects are created from a live multimedia stream that is transcoded into an optimal digital format at an optimal encoding rate reflecting available network bandwidth and converting the input multimedia stream into audio and video segments by splitting the encoded stream into intervals for access by wireless clients.

4. The method of claim 1, wherein a multimedia file is scanned for an I-frame, and a multimedia segment is split at the I-frame to create the video segment, together with a separate audio segment.

5. The method of claim 1, wherein multimedia objects are split from multiple MPEG4 composite layer streams by scanning time intervals and splitting the multimedia objects into video multimedia objects at next I-frames.

6. A multimedia player comprising:
    computer executable instructions stored on a non-transitory computer readable medium which when executed by a processor:
    requests transmission of multimedia objects;
    receives audio and video segments encoded in a digital encoding format and with an encoding rate; wherein, said audio and video segments are associated object parameters and supplied host and path identification to form multimedia objects; and wherein said multimedia objects are located using http and received by said multimedia player from servers using a wireless connection;
    plays back received multimedia objects in a sequence such that fluidity, video quality and audio quality are maintained by selecting a plurality of said multimedia objects that reflect available network bandwidth, autonomously adjusting said selection and playback according to the multimedia object parameters and supplied host path identification, and by utilizing optimized decoding processes to maintain quality playback.

7. A system comprising
    at least one centralized content server transmitting multimedia objects; said multimedia objects including segmented audio and video, and parameters and supplied host path identification;
    at least one multimedia player configured to:
    request transmission of multimedia objects;
    receive audio and video segments encoded in a digital encoding format and with an encoding rate; wherein, said audio and video segments are associated object parameters and supplied host and path identification to form multimedia objects; and wherein said multimedia objects are located using http and received by said multimedia player from servers using a wireless connection;
    play back received multimedia objects in a sequence such that fluidity, video quality and audio quality are maintained by selecting a plurality of said multimedia objects that reflect available network bandwidth, autonomously adjusting said selection and playback according to the multimedia object parameters and supplied host path identification, and by utilizing optimized decoding processes to maintain quality playback.

8. The method of claim 1, wherein the multimedia objects are created from existing multimedia files that have been transcoded into optimal digital formats at an optimal encoding rates reflecting available network bandwidth, and converting them into audio and video segments by splitting the encoded files into intervals for access by wireless clients.

9. The method according to claim 1, wherein the object parameters and supplied identification of the first player received multimedia object define a sequence of similar multimedia objects and configure the player accordingly, using object parameters and video decoding optimization, such that fluidity, video and audio quality are maintained.

* * * * *